(12) United States Patent
Hasegawa et al.

(10) Patent No.: US 7,229,706 B2
(45) Date of Patent: Jun. 12, 2007

(54) MAGNETIC DETECTING ELEMENT HAVING PINNED MAGNETIC LAYERS DISPOSED ON BOTH SIDES OF FREE MAGNETIC LAYER

(75) Inventors: Naoya Hasegawa, Niigata-ken (JP); Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 99 days.

(21) Appl. No.: 10/755,640

(22) Filed: Jan. 12, 2004

(65) Prior Publication Data

US 2004/0141260 A1 Jul. 22, 2004

(30) Foreign Application Priority Data

Jan. 15, 2003 (JP) .............................. 2003-006626
Jan. 15, 2003 (JP) .............................. 2003-006627

(51) Int. Cl.
*G11B 5/39* (2006.01)
*G11B 5/127* (2006.01)

(52) U.S. Cl. ................................ 428/811.5; 428/811.2; 428/812; 360/324.11; 360/324.12

(58) Field of Classification Search .................... None
See application file for complete search history.

(56) References Cited

U.S. PATENT DOCUMENTS 5,552,949 A 9/1996 Hashimoto et al.

6,023,395 A 2/2000 Dill et al.
6,396,668 B1 5/2002 Mao
6,411,478 B1 6/2002 Mao
6,767,655 B2 * 7/2004 Hiramoto et al. ............ 428/692
2003/0227724 A1 * 12/2003 Li et al. ................. 360/324.12
2004/0052007 A1 * 3/2004 Mauri et al. ........... 360/324.11

FOREIGN PATENT DOCUMENTS

JP 2001-68759 3/2001

* cited by examiner

*Primary Examiner*—Kevin M. Bernatz
(74) *Attorney, Agent, or Firm*—Brinks Hofer Gilson & Lione

(57) ABSTRACT

The present invention provides a magnetic detecting element capable of increasing a difference between the ease of a conduction electron flow in a low-resistance state and the ease of a conduction electron flow in a high-resistance state to increase a resistance change $\Delta R$. In the magnetic detecting element, a free magnetic layer or a pinned magnetic layer has a synthetic ferromagnetic structure including a first free magnetic sub-layer or a first pinned magnetic sub-layer containing a magnetic material having a positive $\beta$ value, and a second magnetic sub-layer or a second pinned magnetic sub-layer containing a magnetic material having a negative $\beta$ value. The $\beta$ value is characteristics of a magnetic material satisfying the relationship $\rho\downarrow/\rho\uparrow=(1+\beta)/(1-\beta)(-1\leq\beta\leq 1)$(wherein $\rho\downarrow$ represents resistivity for minority conduction electrons, and $\rho\uparrow$ represents resistivity for majority conduction electrons).

4 Claims, 14 Drawing Sheets

MAGNETIC DETECTING ELEMENT HAVING PINNED MAGNETIC LAYERS DISPOSED ON BOTH SIDES OF FREE MAGNETIC LAYER

This application claims the benefit of priority to Japanese Patent Application Nos. 2003-006626 and 2003-006627, herein incorporated by reference.

BACKGROUND OF THE INVENTION

1. Field of the Invention

The present invention relates to a magnetic detecting element comprising pinned magnetic layers adjacent to both end surfaces of a free magnetic layer through nonmagnetic material layers so that a sense current flows in a direction crossing the interfaces between the free magnetic layer and the nonmagnetic material layers and the interfaces between the pinned magnetic layers and the nonmagnetic material layers. Particularly, the present invention relates to a magnetic detecting element capable of effectively improving a rate ΔR/R of change in resistance.

2. Description of the Related Art

With improvements in the linear recording density of a recording medium there have recently been demands for a shorter gap length. The gap length is defined by a distance between upper and lower shields. The upper and lower shields comprise a magnetic material and are respectively formed at the top and bottom of a reproducing magnetic detecting element.

The mainstream of conventional reproducing magnetic heads for reading a signal magnetic field from a magnetic recording medium is a spin-valve GMR magnetic detecting element comprising a free magnetic layer comprising a thin film comprising a ferromagnetic material, and a pinned magnetic layer laminated thereon through a nonmagnetic material layer in a direction perpendicular to the film plane. However, in the system in which the free magnetic layer, the nonmagnetic material layer and the pinned magnetic layer are laminated in the direction perpendicular to the film plane, it is difficult to further shorten the gap length.

Therefore, there has been proposed a magnetic detecting element in which pinned magnetic layers face both end surfaces of a free magnetic layer through nonmagnetic material layers so that a sense current flows in a direction crossing the interfaces between the free magnetic layer and the nonmagnetic material layers and the interfaces between the pinned magnetic layers and the nonmagnetic material layers, as shown in FIG. 13.

FIG. 13 is a partial sectional view showing a magnetic detecting element, as viewed from a surface facing a recording medium. In the magnetic detecting element shown in FIG. 13, a free magnetic layer 4 comprising a soft magnetic material such as NiFe or the like is formed in a substantially trapezoidal shape on a lower shield layer 1 comprising a magnetic material through a gap layer 2 comprising an insulating material and an underlying layer 3 comprising Cr or Ta. A nonmagnetic material layer 5 is formed to extend from each end surface 4a of the free magnetic layer 4 to each of both side portions of the lower gap layer 2 on both sides of the free magnetic layer 4. Furthermore, pinned magnetic layers 6 each comprising a soft magnetic material such as NiFe or the like are formed in contact with the respective nonmagnetic material layers 5. Also, antiferromagnetic layers 7 are laminated on the respective pinned magnetic layers 6 so that an exchange coupling magnetic field is produced at each of the interfaces between the pinned magnetic layers 6 and the nonmagnetic antiferromagnetic layers 7 to pin the magnetization direction of each pinned magnetic layer 6 in the direction antiparallel to the Y direction shown in the drawing. Furthermore, an upper gap layer 8 comprising an insulating material, and an upper shield layer 9 comprising a magnetic material are formed on the free magnetic layer 4 and the antiferromagnetic layers 7.

A sense current flows through the pinned magnetic layers 6, the nonmagnetic material layers 5 and the free magnetic layer 4 in the X direction shown in the drawing. Namely, the sense current flows in a direction crossing the interfaces between the free magnetic layer 4 and the nonmagnetic material layers 5 and the interfaces between the pinned magnetic layers 6 and the nonmagnetic material layers 5. The free magnetic layer 4 is put into a single magnetic domain state in the X direction. When an external magnetic field is applied in the Y direction, the magnetization direction of the free magnetic layer 4 rotates to the Y direction. When the magnetization direction of the free magnetic layer 4 rotates in a state wherein the magnetization direction of each pinned magnetic layer 6 is pinned in the direction antiparallel to the Y direction, the resistance of the magnetic detecting element changes. The change in the resistance of the magnetic detecting element is taken out as a current change or voltage change to detect the external magnetic field. A magnetic detecting element having the above-described structure is disclosed in U.S. Pat. Nos. 6,396,668B1 and 6,411,478B1 and Japanese Unexamined Patent Application Publication No. 2001-319313. U.S. Pat. No. 6,396,668B1 discloses a spin-vale GMR magnetoresistive element, and U.S. Pat. No. 6,411,478B1 and Japanese Unexamined Patent Application Publication No. 2001-319313 disclose a spin-valve tunneling magnetoresistive element (TMR).

In the magnetic detecting element having the structure shown in FIG. 13, the sense current flows in the direction crossing the interfaces between the free magnetic layer 4 and the nonmagnetic material layers 5 and the interfaces between the pinned magnetic layers 6 and the nonmagnetic material layers 5. Therefore, in the magnetic detecting element shown in FIG. 13, a change in resistance due to an external magnetic field is thought to be mainly derived from bulk scattering of conduction electrons in the free magnetic layer 4 and the pinned magnetic layers 6. Therefore, a greater change ΔR in resistance than a magnetoresistive effect derived from scattering of the sense current at the interfaces between the free magnetic layer and the nonmagnetic material layers or the interfaces between the pinned magnetic layers and the nonmagnetic material layers can be obtained.

Also, in a magnetic detecting element utilizing spin-dependent bulk scattering of conduction electrons, the resistance R of the element itself must be increased to some extent for detecting a magnetic field. In the magnetic detecting element having the shape shown in FIG. 13, the sense current flows in the direction crossing the interfaces between the end surfaces 4a of the free magnetic layer 4 and the nonmagnetic material layers 5 and the interfaces between the inner end surfaces 6a of the pinned magnetic layers 6 and the nonmagnetic material layers 5, and thus the sectional area of the sense current path can be decreased. Therefore, the resistance R of the magnetic detecting element can be increased, as compared with the magnetic detecting element in which the sense current flows in the direction perpendicular to the film plane of each of the free magnetic layer 4, the nonmagnetic material layers 5 and the pinned magnetic layers 6.

In the magnetic detecting element in which the sense current flows in the direction perpendicular to the film plane of each of the free magnetic layer 4, the nonmagnetic material layers 5 and the pinned magnetic layers 6, the thickness of each magnetic layer must be increased for attaining a sufficient change in magnetoresistance. However, in the magnetic detecting element having the shape shown in FIG. 13, the current flows in parallel with the film plane, and thus a change in magnetoresistance can easily be increased because the dimension of the magnetic detecting element in a direction parallel to the film plane is larger than the thickness dimension.

Furthermore, the pinned magnetic layers 6 are not laminated above or below the free magnetic layer 4 functioning as a portion for detecting a magnetic field, and thus the distance between upper and lower shields provided above and below the free magnetic layer 4 can be decreased to facilitate narrowing of the gap.

As shown in FIG. 14, when a free magnetic layer 14 has a synthetic ferrimagnetic structure in which magnetic layers 11 and 13 comprising a soft magnetic material are laminated with a nonmagnetic intermediate sub-layer 12 provided therebetween, the obtained effect is the same as that obtained by decreasing the thickness of the free magnetic layer, and the effective magnetic moment per unit area is decreased to facilitate a change in magnetization of the free magnetic layer. A conventional magnetic detecting element comprises the free magnetic layer 14 including the magnetic layers 11 and 13 both of which comprise NiFe or CoFe. The nonmagnetic intermediate sub-layer 12 comprises Ru.

However, the magnetic detecting element shown in FIG. 14 causes the following problem.

In the magnetic detecting element shown in FIG. 14, magnetization of each pinned magnetic layer 16 is pinned in the direction antiparallel to the Y direction shown in the drawing.

The magnetic layer 11 of the free magnetic layer 14 is put into a single magnetic domain state in the X direction shown in the drawing, and magnetization of the magnetic layer 13 is oriented in the direction antiparallel to the X direction due to a RKKY interaction through the nonmagnetic intermediate sub-layer 12. Of the magnetic layers 11 and 13 of the free magnetic layer 14, the effective magnetic moment (the product of saturation magnetization Ms and thickness t) per unit area of the magnetic layer 11 is larger than that of the magnetic layer 13.

For example, when an external signal magnetic field is applied to the magnetic detecting element shown in FIG. 14 in the Y direction, magnetization of the magnetic layer 11 having the larger effective magnetic moment per unit area rotates to the Y direction. At the same time, the magnetization direction of each pinned magnetic layer 6 approaches the direction antiparallel to the magnetization direction of the magnetic layer 11, and thus the electric resistance for the current flowing from the pinned magnetic layers 6 to the magnetic layer 11 through the nonmagnetic material layers 5 is increased.

However, when the magnetization of the magnetic layer 11 rotates to the Y direction, magnetization of the magnetic layer 13 rotates to the direction antiparallel to the Y direction, and thus the magnetization direction of each pinned magnetic layer 6 approaches a direction parallel to the magnetization direction of the magnetic layer 13. Therefore, the electric resistance for the current flowing from the pinned magnetic layers to the magnetic layer 13 through the nonmagnetic material layers 5 is decreased.

Namely, in the magnetic detecting element shown in FIG. 14, an increase in the electric resistance for the current flowing from the pinned magnetic layers 6 to the magnetic layer 11 through the nonmagnetic material layers 5 is canceled by a decrease in the electric resistance for the current flowing from the pinned magnetic layers 6 to the magnetic layer 13 through the nonmagnetic material layers 5, thereby decreasing a change ΔR in resistance of the magnetic detecting element.

As shown in FIG. 26, when each of pinned magnetic layers 14 has a synthetic ferrimagnetic structure in which magnetic layers 11 and 13 each comprising a soft magnetic material are laminated with a nonmagnetic intermediate sub-layer 12 provided therebetween, magnetization of each pinned magnetic layer 14 can be strongly pinned. Therefore, magnetic detection output can be increased, and output symmetry can be improved. A conventional magnetic detecting element comprises the pinned magnetic layers 14 each including the magnetic layers 11 and 13 both of which comprise NiFe or CoFe. The nonmagnetic intermediate sub-layers 12 comprise Ru.

However, the magnetic detecting element shown in FIG. 26 causes the following problem.

In the magnetic detecting element shown in FIG. 26, magnetization of the free magnetic layer 4 is put into a single-magnetic-domain state in the X direction shown in the drawing.

Magnetization of the magnetic layer 11 of each pinned magnetic layer 14 is pinned in the direction antiparallel to the Y direction shown in the drawing due to an exchange coupling magnetic field with the antiferromagnetic layer 7, and magnetization of the magnetic layer 13 is oriented in the Y direction due to a RKKY interaction through the nonmagnetic intermediate sub-layer 12. Of the magnetic layers 11 and 13 of each pinned magnetic layer 14, the effective magnetic moment (the product of saturation magnetization Ms and thickness t) per unit area of the magnetic layer 13 is larger than that of the magnetic layer 11.

For example, when an external signal magnetic field is applied to the magnetic detecting element shown in FIG. 26 in the Y direction, magnetization of the free magnetic layer 4 rotates to the Y direction. At the same time, the magnetization direction of the free magnetic layer 4 approaches the direction antiparallel to the magnetization direction of the magnetic layers 11, and thus the electric resistance for the current flowing from the magnetic layers 11 to the free magnetic layer 4 through the nonmagnetic material layers 5 is increased.

However, when the magnetization of the free magnetic layer 4 is rotated to the Y direction, the magnetization direction of the free magnetic layer 4 comes close to a direction parallel to the magnetization direction of the magnetic layers 13. Therefore, the electric resistance for the current flowing from the magnetic layers 13 to the free magnetic layer 4 through the nonmagnetic material layers 5 is decreased.

Namely, in the magnetic detecting element shown in FIG. 26, an increase in the electric resistance for the current flowing from the magnetic layers 11 to the free magnetic layer 4 through the nonmagnetic material layers 5 is canceled by a decrease in the electric resistance for the current flowing from the magnetic layers 13 to the free magnetic layer 4 through the nonmagnetic material layers 5, thereby decreasing a change ΔR in resistance of the magnetic detecting element.

SUMMARY OF THE INVENTION

The present invention has been achieved for solving the above problems of the conventional magnetic detecting elements, and an object of the present invention is to provide a magnetic detecting element capable of increasing a difference between the ease of a conduction electron flow in a low-resistance state and the ease of a conduction electron flow in a high-resistance state, for increasing a change $\Delta R$ in resistance.

A magnetic detecting element of the present invention comprises a free magnetic layer formed on a lower gap layer comprising an insulating material, and pinned magnetic layers facing the end surfaces of the free magnetic layer through nonmagnetic material layers so that a sense current flows in a direction crossing the interfaces between the free magnetic layer and the nonmagnetic material layers and the interfaces between the pinned magnetic layers and the nonmagnetic material layers, wherein the free magnetic layer has a synthetic ferrimagnetic structure in which a first free magnetic sub-layer comprising a magnetic material having a positive $\beta$ value, and a second free magnetic sub-layer comprising a magnetic material having a negative $\beta$ value are laminated with a nonmagnetic intermediate sub-layer provided therebetween.

The $\beta$ value is characteristic of a magnetic material satisfying the relationship $\rho\downarrow/\rho\uparrow=(1+\beta)/(1-\beta)$ $(-1 \leq \beta \leq 1)$ (wherein $\rho\downarrow$ represents resistivity for minority conduction electrons, and $\rho\uparrow$ represents resistivity for majority conduction electrons).

When a current flows through a magnetic material, the resistivity for the majority conduction electrons is different from the resistivity for the minority conduction electrons in the magnetic material.

The magnetic moment of a constituent magnetic atom of the magnetic material is mainly defined by the orbital magnetic moment and spin magnetic moment of 3d-orbit or 4f-orbit electrons. The electrons present in the 3d orbit or 4f orbit of a magnetic atom basically have different numbers of spin up and spin down electrons. The spin of a larger number of electrons among the spin up electrons and spin down electrons present in the 3d orbit or 4f orbit is referred to as "majority spin", and the spin of a smaller number of electrons is referred to as "minority spin".

On the other hand, a current flowing through a magnetic material contains substantially the same number of spin up conduction electrons and spin down conduction electrons. Among the spin up and spin down conduction electrons, the conduction electrons having the same spin as the majority spin of the magnetic material are referred to as "majority conduction electrons", and the conduction electrons having the same spin as the minority spin of the magnetic material are referred to as "minority conduction electrons".

Assuming that $\rho\downarrow$ represents the resistivity of a magnetic material for the minority conduction electrons, and $\rho\uparrow$ represents the resistivity for the majority conduction electrons, the value $\beta$ characteristic of the magnetic material can be defined by the following relationship:

$$\rho\downarrow/\rho\uparrow=(1+\beta)/(1-\beta) \; (-1 \leq \beta \leq 1)$$

Namely, when the $\beta$ value of the magnetic material is positive ($\beta>0$), the relation $\rho\downarrow>\rho\uparrow$ is established, and the majority conduction electrons easily flow through the magnetic material. On the other hand, when the $\beta$ value of the magnetic material is negative ($\beta<0$), the relation $\rho\downarrow<\rho\uparrow$ is established, and the minority conduction electrons easily flow through the magnetic material.

In order to increase the change $\Delta R$ in resistance of the magnetic detecting element, in all of the magnetic layers, the resistance for the spin up conduction electrons is preferably smaller than that for the spin down conduction electrons with no external magnetic field applied to the magnetic detecting element. Alternatively, in all of the magnetic layers, the resistance for the spin down conduction electrons is preferably smaller than that for the spin up conduction electrons.

In the present invention, the free magnetic layer has the synthetic ferrimagnetic structure including the first free magnetic sub-layer comprising a magnetic material having a positive $\beta$ value and the second free magnetic sub-layer comprising a magnetic material having a negative $\beta$ value. The first and second free magnetic sub-layers have antiparallel magnetization directions due to a RKKY interaction therebetween through the nonmagnetic intermediate sub-layer.

Also, the majority conduction electrons easily flow through the first free magnetic sub-layer, and the minority conduction electrons easily flow through the second free magnetic sub-layer. When the majority conduction electrons of the first free magnetic sub-layer are spin up electrons, the minority conduction electrons of the second free magnetic sub-layer having the magnetization direction opposite to the first free magnetic sub-layer are also spin up electrons. Namely, with no external magnetic field applied, the spin up electrons easily flow through both the first and second free magnetic sub-layers.

When an external magnetic field is applied, the magnetization direction of the first free magnetic sub-layer relative to the pinned magnetic layers is different from that of the second free magnetic sub-layer relative to the pinned magnetic layers. However, the spin up electrons have difficulty in flowing through both the first and second free magnetic sub-layers.

Namely, both the electric resistance for the current flowing from the pinned magnetic layers to the first free magnetic sub-layer through the nonmagnetic material layers and the electric resistance for the current flowing from the pinned magnetic layers to the second free magnetic sub-layer through the nonmagnetic material layers are increased.

Therefore, in the magnetic detecting element of the present invention, even when the free magnetic layer has the synthetic ferrimagnetic structure, a difference between the ease of a conduction electron flow in a low-resistance state and the ease of a conduction electron flow in a high-resistance state can be increased to increase the change $\Delta R$ in resistance.

Each of the pinned magnetic layers may comprise either a material having a positive $\beta$ value or a material having a negative $\beta$ value.

However, the magnetic material used for forming the thickest magnetic sub-layer among the magnetic sub-layers constituting the free magnetic layer preferably has a $\beta$ value with the same positive or negative sign as that of the $\beta$ value of the magnetic material used for forming the pinned magnetic layers because a flow of conduction electrons in a low-resistance state can be facilitated to increase the change $\Delta R$ in resistance.

Also, when a nonmagnetic layer comprising a nonmagnetic material is laminated on a magnetic layer comprising a magnetic material, an interfacial resistance occurs at the interface between the magnetic layer and the nonmagnetic layer.

The value of interfacial resistance for the majority conduction electrons is also different from that for the minority conduction electrons.

Assuming that $r\downarrow$ represents an interfacial resistance for the minority conduction electrons, and $r\uparrow$ represents an interfacial resistance for the majority conduction electrons, a value $\gamma$ characteristic of a combination of a magnetic material land a nonmagnetic material can be defined by the following relationship:

$$r\downarrow/r\uparrow=(1+\gamma)/(1-\gamma) \ (-1\leq\gamma\leq 1)$$

Namely, when the $\gamma$ value is positive ($\gamma>0$), the relation $r\downarrow>r\uparrow$ is established, and the majority conduction electrons easily flow through the interface. On the other hand, when the $\gamma$ value is negative ($\gamma<0$), the relation $r\downarrow<r\uparrow$ is established, and the minority conduction electrons easily flow through interface.

In the present invention, at the interface between the first free magnetic sub-layer and the nonmagnetic intermediate sub-layer and/or the interface between the second free magnetic sub-layer and the nonmagnetic intermediate sub-layer, the positive or negative sign of the $\gamma$ value is preferably equal to that of the $\beta$ value of the magnetic layer in contact with the interface because a flow of conduction electrons in a low-resistance state can be facilitated to increase the change $\Delta R$ in resistance.

A magnetic detecting element of the present invention comprises a free magnetic layer disposed on a lower gap layer comprising an insulating material, and pinned magnetic layers facing both end surfaces of the free magnetic layer through nonmagnetic material layers so that a sense current flows in a direction crossing the interfaces between the free magnetic layer and the nonmagnetic material layers and the interfaces between the pinned magnetic layers and the nonmagnetic material layers, wherein assuming that a NiX alloy (wherein X is one element selected from Co, Fe, Mn, Zr, Hf, Cu, and Au), a CoT alloy (wherein T is one element selected from Fe, Zr, Ta, and Hf), a FeZ alloy (wherein Z is one element selected from Ni, Co, Rh, Pt, Ir, Be, Al, Si, Ga, and Ge), and a Co—Mn—D alloy (wherein D is one element selected from Al, Ga, Si, Ge, and Sn) belong to group A, and a NiM alloy (wherein M is one element selected from Cr, Rh, Ru, Mo, Nb, Pt, Ir, Os, Re, W, and Ta), a CoQ alloy (wherein Q is one element selected from Mn, Cr, Ru, Mo, Ir, Os, Re, and W), and an FeA alloy (wherein A is one element selected from Mn, Cr, V, Ti, Ru, Mo, Os, Re, and W) belong to group B, the free magnetic layer has a synthetic ferrimagnetic structure comprising a first free magnetic sub-layer comprising a magnetic material belonging to the group A, and a second free magnetic sub-layer comprising a material belonging to the group B, the first and second free magnetic sub-layers being laminated with a nonmagnetic intermediate sub-layer provided therebetween.

In the present invention, the magnetic material for forming each of the magnetic layers is defined as described above, so that the first free magnetic sub-layer of the free magnetic layer comprises a magnetic material having a positive $\beta$ value, and the second free magnetic sub-layer comprises a magnetic material having a negative $\beta$ value. The first and second free magnetic sub-layers have antiparallel magnetization directions due to a RKKY interaction therebetween through the nonmagnetic intermediate sub-layer.

Therefore, the majority conduction electrons easily flow through the first free magnetic sub-layer, and the minority conduction electrons easily flow through the second free magnetic sub-layer. When the majority conduction electrons of the first free magnetic sub-layer are spin up electrons, the minority conduction electrons of the second free magnetic sub-layer having the magnetization direction opposite to the first free magnetic sub-layer are also spin up electrons. Namely, with no external magnetic field applied, the spin up electrons easily flow through both the first and second free magnetic sub-layers.

When an external magnetic field is applied, the magnetization direction of the first free magnetic sub-layer relative to the pinned magnetic layers is different from that of the second free magnetic sub-layer relative to the pinned magnetic layers. However, the spin up electrons have difficulty in flowing through both the first and second free magnetic sub-layers.

Namely, both the electric resistance for the current flowing from the pinned magnetic layers to the first free magnetic sub-layer through the nonmagnetic material layers and the electric resistance for the current flowing from the pinned magnetic layers to the second free magnetic sub-layer through the nonmagnetic material layers are increased.

Therefore, in the magnetic detecting element of the present invention, a difference between the ease of a conduction electron flow in a low-resistance state and the ease of a conduction electron flow in a high-resistance state can be increased to increase the change $\Delta R$ in resistance.

Each of the pinned magnetic layers may comprise either a magnetic material belonging to the group A or a magnetic material belonging to the group B.

However, when each of the pinned magnetic layers comprises a magnetic material belonging to the group A, the thickest magnetic sub-layer among the magnetic sub-layers which constitute the free magnetic layer preferably comprises a material belonging to the group A, for facilitating a flow of conduction electrons in a low-resistance state to increase the change $\Delta R$ in resistance. When each of the pinned magnetic layers comprises a magnetic material belonging to the group B, the thickest magnetic sub-layer among the magnetic sub-layers which constitute the free magnetic layer preferably comprises a material belonging to the group B.

When the nonmagnetic intermediate sub-layer formed between the first and second free magnetic sub-layers which constitute the free magnetic layer comprises a nonmagnetic material composed of at least one element selected from Ru, Cr, Rh, Ir, and Os, the positive or negative sign of $\gamma$ at the interface between the second free magnetic sub-layer and the nonmagnetic intermediate sub-layer can be made equal to the positive or negative sign of $\beta$ of the magnetic layer in contact with the interface. Therefore, a flow of conduction electrons in a low-resistance state can be facilitated to increase the change $\Delta R$ in resistance.

A magnetic detecting element of the present invention comprises a free magnetic layer disposed on a lower gap layer comprising an insulating material, and pinned magnetic layers opposing both end surfaces of the free magnetic layer through nonmagnetic material layers so that a sense current flows in a direction crossing the interfaces between the free magnetic layer and the nonmagnetic material layers and the interfaces between the pinned magnetic layers and the nonmagnetic material layers, wherein the free magnetic layer has a synthetic ferrimagnetic structure comprising a first free magnetic sub-layer and a second free magnetic sub-layer comprising a magnetic material having higher resistivity than that of a magnetic material for forming the first free magnetic sub-layer, the first and second free magnetic sub-layers being laminated with a nonmagnetic intermediate sub-layer provided therebetween.

In the present invention, for example, when β>0, the resistivity for the majority conduction electrons of the second free magnetic sub-layer magnetized in the direction antiparallel to the magnetization direction of the first free magnetic sub-layer is higher than that of the first free magnetic sub-layer, thereby inhibiting a flow of the conduction electrons of the sense current.

Therefore, a change in electric resistance for the current flowing from the pinned magnetic layers to the first free magnetic sub-layer through the nonmagnetic material layers can be prevented from being canceled by a change in electric resistance for the current flowing from the pinned magnetic layers to the second free magnetic sub-layer through the nonmagnetic material layers. Thus, the change ΔR in resistance of the magnetic detecting element can be increased.

A magnetic detecting element of the present invention comprises a free magnetic layer disposed on a lower gap layer comprising an insulating material, and pinned magnetic layers facing both end surfaces of the free magnetic layer through nonmagnetic material layers so that a sense current flows in a direction crossing the interfaces between the free magnetic layer and the nonmagnetic material layers and the interfaces between the pinned magnetic layers and the nonmagnetic material layers, wherein the free magnetic layer has a synthetic ferrimagnetic structure comprising a first free magnetic sub-layer and a second free magnetic sub-layer comprising a material having a smaller absolute value of β than that of a magnetic material for forming the first free magnetic sub-layer, the first and second free magnetic sub-layers being laminated with a nonmagnetic intermediate sub-layer provided therebetween.

The β value is characteristic of a magnetic material satisfying the relationship $\rho\downarrow/\rho\uparrow=(1+\beta)/(1-\beta)$ $(-1\leq\beta\leq1)$ (wherein $\rho\downarrow$ represents a resistivity for minority conduction electrons, and $\rho\uparrow$ represents a resistivity for majority conduction electrons).

In the present invention, the resistivity for the majority conduction electrons of the second free magnetic sub-layer which is magnetized in the direction antiparallel to the magnetization direction of the first free magnetic sub-layer is increased to inhibit a flow of the conduction electrons of the sense current.

Therefore, a change in the electric resistance for the current flowing from the pinned magnetic layers to the first free magnetic sub-layer through the nonmagnetic material layers can be prevented from being canceled by a change in the electric resistance for the current flowing from the pinned magnetic layers to the second free magnetic sub-layer through the nonmagnetic material layers. Thus, the change ΔR in resistance of the magnetic detecting element can be increased.

The first free magnetic sub-layer comprises, for example, a NiFe alloy or CoFe alloy, and the second free magnetic sub-layer comprises, for example, a NiFeX alloy (wherein X is one element selected from Nb, Zr, Ti, Hf, Ta, Mo, W, Rh, Cr, Ru, Pt, Ir, and Sb), or a CoT alloy (wherein T is one element selected from Al, Si, Ti, V, Cr, Mn, Zr, Nb, Mo, Ru, Rh, Hf, Ta, W, Re, and Ir), or a CoFeT alloy (wherein T is one element selected from Al, Si, Ti, V, Cr, Mn, Zr, Nb, Mo, Ru, Rh, Hf, Ta, W, Re, and Ir).

The magnetic detecting element of the present invention preferably further comprises a specular layer disposed between the first and second free magnetic sub-layers, for reflecting the conduction electrons while maintaining the spin direction of the conduction electrons. Alternatively, a specular layer is preferably formed in contact with the surface of the first free magnetic sub-layer and/or the surface of the second free magnetic sub-layer opposite to the surface in contact with the nonmagnetic intermediate sub-layer.

On the other hand, as shown in FIG. 15, both an electric resistance for a current flowing from first pinned magnetic sub-layers to a free magnetic layer through nonmagnetic material layers and an electric resistance for a current flowing from second pinned magnetic sub-layers to the free magnetic layer through the nonmagnetic material layers are increased.

Therefore, in the magnetic detecting element of the present invention, even when each of the pinned magnetic layers has a synthetic ferrimagnetic structure, a difference between the ease of a conduction electron flow in a low-resistance state and the ease of a conduction electron flow in a high-resistance state can be increased to increase the change ΔR in resistance.

The free magnetic layer may comprise either a magnetic material having a positive β value or a magnetic material having a negative β value.

However, the magnetic material used for forming the thickest magnetic sub-layer among the magnetic sub-layers constituting each pinned magnetic layer preferably has a β value with the same positive or negative sign as that of the β value of the magnetic material used for forming the free magnetic layer because a flow of conduction electrons in a low-resistance state can be facilitated to increase the change ΔR in resistance.

In the present invention, the magnetic material for forming each of the magnetic layers is defined as described above, so that the first pinned magnetic sub-layer of each pinned magnetic layer comprises a magnetic material having a positive β value, and the second pinned magnetic sub-layer comprises a magnetic material having a negative β value. The first and second pinned magnetic sub-layers have antiparallel magnetization directions due to a RKKY interaction therebetween through the nonmagnetic intermediate sub-layer.

As described above, when an external magnetic field is not applied, the spin up electrons easily flow through both the first and second pinned magnetic sub-layers.

When an external magnetic field is applied, the magnetization direction of each first pinned magnetic sub-layer relative to the free magnetic layer is different from that of each second pinned magnetic sub-layer relative to the free magnetic layer. However, spin up electrons have difficulty in flowing through both the first pinned magnetic sub-layers and the second pinned magnetic sub-layers.

Namely, both the electric resistance for the current flowing from the first pinned magnetic sub-layers to the free magnetic layer through the nonmagnetic material layers and the electric resistance for the current flowing from the second pinned magnetic sub-layers to the free magnetic layer through the nonmagnetic material layers are increased.

Therefore, in the magnetic detecting element of the present invention, a difference between the ease of a conduction electron flow in a low-resistance state and the ease of a conduction electron flow in a high-resistance state can be increased to increase the change ΔR in resistance.

The free magnetic layer may comprise either a magnetic material belonging to the group A or a magnetic material belonging to the group B.

However, when the free magnetic layer comprises a magnetic material belonging to the group A, the thickest magnetic sub-layer among the magnetic sub-layers which constitute the pinned magnetic layers preferably comprises a material belonging to the group A, for facilitating a flow of conduction electrons in a low-resistance state to increase the change ΔR in resistance. When the free magnetic layer comprises a magnetic material belonging to the group B, the thickest magnetic sub-layer among the magnetic sub-layers which constitute each pinned magnetic layer preferably comprises a material belonging to the group B.

When the nonmagnetic intermediate sub-layer formed between the first and second pinned magnetic sub-layers which constitute each pinned magnetic layer comprises a nonmagnetic material composed of at least one element selected from Ru, Cr, Rh, Ir, and Os, the positive or negative sign of γ at the interface between the second pinned magnetic sub-layer and the nonmagnetic intermediate sub-layer can be made equal to the positive or negative sign of β of the magnetic layer in contact with the interface. Therefore, a flow of conduction electrons in a low-resistance state can be further facilitated to increase the change ΔR in resistance.

A magnetic detecting element of the present invention comprises a free magnetic layer disposed on a lower gap layer comprising an insulating material, and pinned magnetic layers facing both end surfaces of the free magnetic layer through nonmagnetic material layers so that a sense current flows in a direction crossing the interfaces between the free magnetic layer and the nonmagnetic material layers and the interfaces between the pinned magnetic layers and the nonmagnetic material layers, wherein each of the pinned magnetic layers has a synthetic ferrimagnetic structure comprising a first pinned magnetic sub-layer and a second pinned magnetic sub-layer comprising a magnetic material having higher resistivity than that of a magnetic material for forming the first pinned magnetic sub-layer, the first and second pinned magnetic sub-layers being laminated with a nonmagnetic intermediate sub-layer provided therebetween.

In the present invention, the resistivity of the second pinned magnetic sub-layers magnetized in the direction antiparallel to the magnetization direction of the first pinned magnetic sub-layers is increased to inhibit a flow of the conduction electrons of the sense current.

Therefore, a change in electric resistance for the current flowing from the first pinned magnetic sub-layers to the free magnetic layer through the nonmagnetic material layers can be prevented from being canceled by a change in electric resistance for the current flowing from the second pinned magnetic sub-layers to the free magnetic layer through the nonmagnetic material layers. Thus, the change ΔR in resistance of the magnetic detecting element can be increased.

A magnetic detecting element of the present invention comprises a free magnetic layer disposed on a lower gap layer comprising an insulating material, and pinned magnetic layers facing both end surfaces of the free magnetic layer through nonmagnetic material layers so that a sense current flows in a direction crossing the interfaces between the free magnetic layer and the nonmagnetic material layers and the interfaces between the pinned magnetic layers and the nonmagnetic material layers, wherein each of the pinned magnetic layers has a synthetic ferrimagnetic structure comprising a first pinned magnetic sub-layer and a second pinned magnetic sub-layer comprising a magnetic material having a smaller absolute value of β than that of a magnetic material for forming the first pinned magnetic sub-layer, the first and second pinned magnetic sub-layers being laminated with a nonmagnetic intermediate sub-layer provided therebetween.

In the present invention, for example, when β>0, the resistivity for the majority conduction electrons of the second pinned magnetic sub-layers which are magnetized in the direction antiparallel to the magnetization direction of the first pinned magnetic sub-layers is higher than that of the first pinned magnetic sub-layers, thereby inhibiting a flow of the conduction electrons of the sense current.

Therefore, a change in the electric resistance for the current flowing from the first pinned magnetic sub-layers to the free magnetic layer through the nonmagnetic material layers can be prevented from being canceled by a change in the electric resistance for the current flowing from the second pinned magnetic sub-layers to the free magnetic layer through the nonmagnetic material layers. Thus, the change ΔR in resistance of the magnetic detecting element can be increased.

Each of the first pinned magnetic sub-layers comprises, for example, a NiFe alloy or CoFe alloy, and each of the second free magnetic sub-layers comprises, for example, a NiFeX alloy (wherein X is one element selected from Nb, Zr, Ti, Hf, Ta, Mo, W, Rh, Cr, Ru, Pt, Ir, and Sb), a CoT alloy (wherein T is one element selected from Al, Si, Ti, V, Cr, Mn, Zr, Nb, Mo, Ru, Rh, Hf, Ta, W, Re, and Ir), or a CoFeT alloy (wherein T is one element selected from Al, Si, Ti, V, Cr, Mn, Zr, Nb, Mo, Ru, Rh, Hf, Ta, W, Re, and Ir).

The magnetic detecting element of the present invention preferably further comprises a specular layer disposed between the first and second pinned magnetic sub-layers, for reflecting the conduction electrons while maintaining the spin direction of the conduction electrons.

Alternatively, a specular layer is preferably formed in contact with the surface of each first pinned magnetic sub-layer and/or the surface of each second pinned magnetic sub-layer opposite to its surface in contact with the nonmagnetic intermediate sub-layer.

DESCRIPTION OF THE PREFERRED EMBODIMENTS

Figure 1:
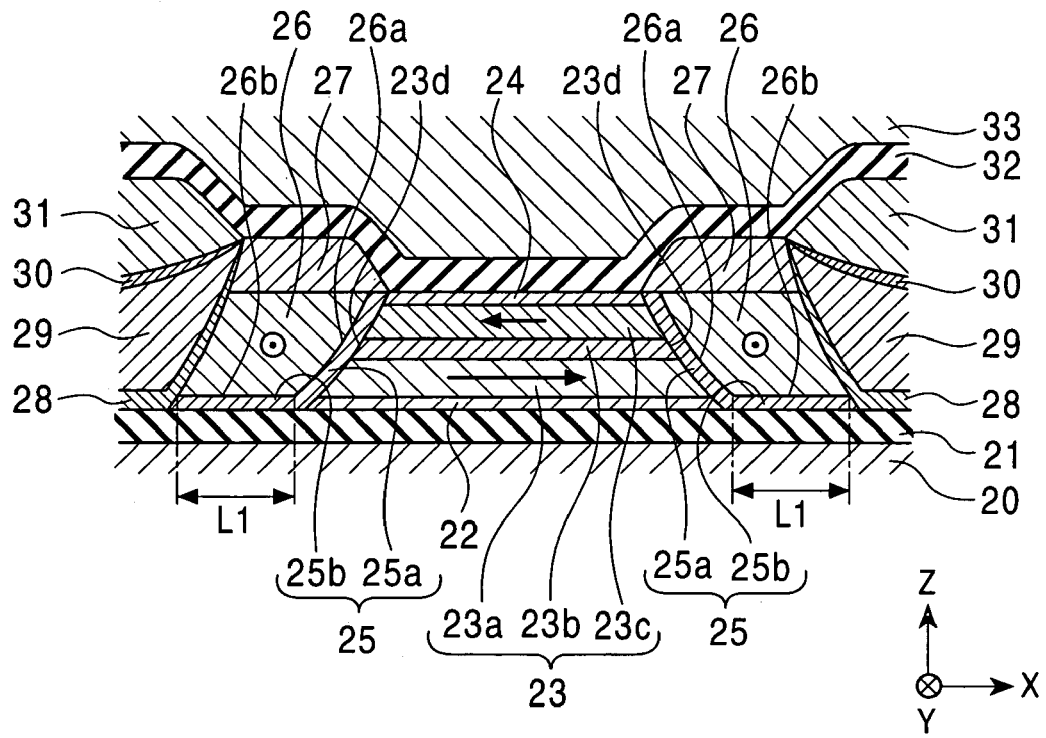
FIG. 1 is a sectional view showing a magnetic detecting element according to a first embodiment of the present invention.

FIG. 1 is a partial sectional view showing the structure of a magnetic detecting element according to an embodiment of the present invention, as viewed from a surface facing a recording medium.

In FIG. 1, reference numeral 20 denotes a lower shield layer comprising a magnetic material such as NiFe or the like. A lower gap layer 21 comprising an insulating material such as alumina or the like is formed on the lower shield layer 20.

Also, a free magnetic layer 23 is formed in a substantially trapezoidal shape on the lower gap layer 21 through an underlying layer 22 comprising Cr or Ta. The track width of the magnetic detecting element is defined by the width dimension (track width direction dimension) of the free magnetic layer 23 in the X direction shown in the drawing. In this embodiment, the track width of the magnetic detecting element is 0.1 μm or less.

The free magnetic layer 23 has a synthetic ferrimagnetic structure including a first free magnetic sub-layer 23a and a second free magnetic sub-layer 23c each comprising a soft magnetic material, the first and second free magnetic sub-layers 23a and 23c being laminated with a nonmagnetic intermediate sub-layer 23b provided therebetween.

In the magnetic detecting element shown in FIG. 1, a nonmagnetic material layer 25 comprising Cu is formed to extend from each end surface 23d of the free magnetic layer 23 to each of both side portions of the lower gap layer 21 on both sides of the free magnetic layer 23. Furthermore, pinned magnetic layers 26 comprising a soft magnetic material are formed in contact with the respective nonmagnetic material layers 25.

Namely, the free magnetic layer 23 faces the pinned magnetic layers 26 through the interstitial portions 25a of the nonmagnetic material layers 25.

Furthermore, an antiferromagnetic layer 27 is laminated on each of the pinned magnetic layers 26 so that an exchange coupling magnetic field is produced at each of the interfaces between the pinned magnetic layers 26 and the antiferromagnetic layers 27 to pin the magnetization direction of each pinned magnetic layer 26 in the direction antiparallel to the Y direction shown in the drawing.

Each of the nonmagnetic material layers 25 comprises the interstitial portion 25a disposed between each of the end surfaces 23d of the free magnetic layer 23 and the inner end surface 26a of each pinned magnetic layer 26, and an extending portion 25b disposed between the bottom 26b of each pinned magnetic layer 26 and the lower gap layer 21. Of the interstitial portions 25a and the extending portions 25b, only the interstitial portions 25a contribute to magnetoresistance. In order to decrease a shunt loss of the sense current, the thickness of each extending portion 25b is preferably smaller than that of each interstitial portion 25a. Also, the extending portions 25b are more preferably removed.

In the magnetic detecting element shown in FIG. 1, hard bias layers 29 are formed on both outsides of the pinned magnetic layers 26 and the antiferromagnetic layers 27 through bias underlying layers 28, for supplying a longitudinal bias magnetic field to the free magnetic layer 23. Each of the hard bias layers 29 comprises CoPt. Furthermore, an electrode layer 31 comprising Cr is deposited on each hard bias layer 29 through an electrode underlying layer 30 comprising Ta.

A protective layer 24 comprising Ta is deposited on the free magnetic layer 23. Also, an upper gap layer 32 comprising an insulating material such as alumina or the like, and an upper shield layer 33 comprising a magnetic material such as NiFe or the like are formed over the protective layer 24, the antiferromagnetic layers 27 and the electrode layers 31.

Each of the antiferromagnetic layers 27 comprises a PtMn alloy, an X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

In forming the antiferromagnetic layers 27, the ratio of Pt or X of the PtMn alloy or an alloy represented by the formula X—Mn is preferably in the range of 37 atomic % to 63 atomic %, and more preferably in the range of 47 atomic % to 57 atomic %. The upper and lower limits of such a numerical range represent "not more than" and "not less than", respectively, unless otherwise specified.

In an alloy represented by the formula Pt—Mn—X', the total of X'+Pt is preferably in the range of 37 atomic % to 63 atomic %, and more preferably 47 atomic % to 57 atomic %. In an alloy represented by the formula Pt—Mn—X', the ratio of X' is preferably in the range of 0.2 atomic % to 10 atomic %. When X' is at least one element of Pd, Ir, Rh, Ru, Os, and Ni, the ratio of X' is preferably in the range of 0.2 atomic % to 40 atomic %.

A heat treatment of the antiferromagnetic layers 27 comprising such an alloy can produce an exchange coupling film comprising each antiferromagnetic layer 27, for producing a large exchange coupling magnetic field. Particularly, the use of the PtMn alloy can produce an excellent exchange coupling film comprising the antiferromagnetic layer 27 and the pinned magnetic layer 26 and having an exchange coupling magnetic field of 48 kA/m or more, e.g., over 64 kA/m, and a blocking temperature of as high as 380° C. at which the exchange coupling magnetic field is lost.

Although these alloys have a disordered face-centered cubic structure (fcc) immediately after film deposition, the structure is transformed to a CuAuI-type ordered face-centered tetragonal structure (fct) by a heat treatment. The thickness of each antiferromagnetic layer 27 is 80 Å to 300 Å.

The sense current supplied from each electrode layer 31 is caused to flow through the pinned magnetic layers 26, the interstitial portions 25a of the nonmagnetic material layers 25, and the free magnetic layer 23 in the X direction shown in the drawing. Namely, the sense current flows in a direction crossing the interfaces between the free magnetic layer 23 and the nonmagnetic material layers 25 and the interfaces between the pinned magnetic layers 26 and the nonmagnetic material layers 25.

In order to increase the change ΔR in resistance of the magnetic detecting element, the width dimension of the free magnetic layer in the direction (the X direction) parallel to the film plane is preferably larger than the spin diffusion length of electrons with spin contributing to a change in magnetoresistance (electrons having a longer mean free path in a low-resistance state among spin up electrons and spin down electrons). The spin diffusion length represents a distance for which electrons flowing through the free magnetic layer can move without a change in spin.

In order to increase the change ΔR in resistance of the magnetic detecting element, the thickness of the free magnetic layer is preferably larger than the mean free path of electrons. The mean free path represents a distance electrons can move through the free magnetic layer without being scattered, and the spin diffusion length is generally larger than the mean free path. This is due to the fact that spin inversion does not occur in scattering of conduction electrons in some cases.

When the thickness of the free magnetic layer is larger than the mean free path of electrons, for example, the mean free path of spin up electrons in a low-resistance state is increased to increase a difference from the mean free path of spin down electrons. Namely, the change ΔR in resistance of the magnetic detecting element is increased.

However, the magnetic thickness (magnetic moment per unit area Ms×t (the product of saturation magnetization Ms and the thickness t of the free magnetic layer)) of the free magnetic layer is increased by increasing the thickness of the free magnetic layer, and thus a amount of magnetization rotation of the free magnetic layer with an external magnetic field applied is decreased. Namely, the magnetic detection sensitivity is decreased.

As in this embodiment, when the free magnetic layer 23 has the synthetic ferrimagnetic structure comprising the first free magnetic sub-layer 23a and the second free magnetic sub-layer 23c each comprising a soft magnetic material, the first and second free magnetic sub-layers 23a and 23c being laminated with the nonmagnetic intermediate sub-layer 23b provided therebetween, the synthetic magnetic thickness (Ms×t) of a total of the magnetic thickness (Ms×t) of the first free magnetic sub-layer 23a and the magnetic thickness (Ms×t) of the second magnetic layer 23c is the magnetic thickness (Ms×t) of the entire free magnetic layer 23.

Since the first free magnetic sub-layer 23a and the second free magnetic sub-layer 23c are in an antiparallel ferrimagnetic state in which the magnetization directions are 180° different due to a RKKY interaction therebetween through the nonmagnetic material layer 23b, the magnetic thickness (Ms×t) of the whole free magnetic layer 23 is obtained by subtracting the magnetic thickness (Ms×t) of the second free magnetic sub-layer 23c from the magnetic thickness (Ms×t) of the first magnetic layer 23a. In this case, it is assumed that the magnetic thickness (Ms×t) of the first free magnetic sub-layer 23a is larger than the magnetic thickness (Ms×t) of the second free magnetic sub-layer 23c.

Namely, in the synthetic ferrimagnetic structure including the first free magnetic sub-layer 23a and the second free magnetic sub-layer 23c, the same effect as that obtained by thinning the free magnetic layer 23 can be obtained. In other words, the magnetic thickness (effective magnetic moment per unit area) of the free magnetic layer 23 is decreased to facilitate a change in magnetization of the free magnetic layer 23, thereby improving the magnetic detection sensitivity of the magnetic detecting element.

Furthermore, the thickness of each of the first free magnetic sub-layer 23a and the second free magnetic sub-layer 23c can be made larger than the mean free path of the layer. The thickness of each of the first free magnetic sub-layer 23a and the second free magnetic sub-layer 23c is, for example, 30 Å to 100 Å.

As described above, the magnetic thickness (Ms×t) of the first free magnetic sub-layer 23a is larger than the magnetic thickness (Ms×t) of the second free magnetic sub-layer 23c. Therefore, the first free magnetic sub-layer 23a is put into a single magnetic domain state in the X direction due to a longitudinal bias magnetic field applied in the X direction, while the second free magnetic sub-layer 23c is put into a single magnetic domain state in the direction antiparallel to the X direction. The magnetization direction of the whole free magnetic layer 23 is aligned with the X direction.

When an external magnetic field is applied in the Y direction, magnetizations of the first free magnetic sub-layer 23a and the second free magnetic sub-layer 23c of the free magnetic layer 23 rotate while maintaining an antiparallel state. In this case, the magnetizations rotate so that the magnetization direction of the first free magnetic sub-layer 23a is aligned in the Y direction. Since the magnetization direction of each pinned magnetic layer 26 is pinned in the direction antiparallel to the Y direction and maintained, the relative angle between the magnetization directions of the pinned magnetic layers 26 and the free magnetic layer 23 changes to change the resistance of the magnetic detecting element. The change in resistance of the magnetic detecting element is taken out as a current change or voltage change to detect the external magnetic field.

The magnetic detecting element of this embodiment is characterized by the materials of the first free magnetic sub-layer 23a, the second free magnetic sub-layer 23c and the nonmagnetic intermediate sub-layer 23b of the free magnetic layer 23.

It is assumed that a NiX alloy (wherein X is one element selected from Co, Fe, Mn, Zr, Hf, Cu, and Au), a CoT alloy (wherein T is one element selected from Fe, Zr, Ta, and Hf), a FeZ alloy (wherein Z is one element selected from Ni, Co, Rh, Pt, Ir, Be, Al, Si, Ga, and Ge), and a Co—Mn—D alloy (wherein D is one element selected from Al, Ga, Si, Ge, and Sn) belong to group A, and a NiM alloy (wherein M is one element selected from Cr, Rh, Ru, Mo, Nb, Pt, Ir, Os, Re, W, and Ta), a CoQ alloy (wherein Q is one element selected from Mn, Cr, Ru, Mo, Ir, Os, Re, and W), and an FeA alloy (wherein A is one element selected from Mn, Cr, V, Ti, Ru, Mo, Os, Re, and W) belong to group B.

In this case, the first free magnetic sub-layer 23a comprises an alloy belonging to group A, and the second free magnetic sub-layer 23c comprises an alloy belonging to group B.

An alloy belonging to group A is a magnetic material having a positive $\beta$ value, and an alloy belonging to group B is a magnetic material having a negative $\beta$ value. However, the $\beta$ value is characteristic of a magnetic material satisfying the relationship $\rho\downarrow/\rho\uparrow=(1+\beta)/(1-\beta)$ $(-1\leq\beta\leq 1)$ (wherein $\rho\downarrow$ represents resistivity for minority conduction electrons, and $\rho\uparrow$ represents resistivity for majority conduction electrons).

In this embodiment, the free magnetic layer 23 has the synthetic ferrimagnetic structure including the first free magnetic sub-layer 23a comprising a magnetic material having a positive $\beta$ value and the second free magnetic sub-layer 23c comprising a magnetic material having a negative $\beta$ value. The first free magnetic sub-layer 23a and the second free magnetic sub-layer 23c are in a state in which the magnetizations thereof are aligned in antiparallel directions due to the RKKY interaction through the nonmagnetic intermediate sub-layer 23b. When the thickness of the nonmagnetic intermediate sub-layer 23b is set to a predetermined value characteristic of its material, the magnetizations of the first free magnetic sub-layer 23a and the second free magnetic sub-layer 23c can be aligned in antiparallel directions. For example, when the nonmagnetic intermediate sub-layer 23b comprises Ru and has a thickness of 3 Å to 10 Å, the magnetizations of the first free magnetic sub-layer 23a and the second free magnetic sub-layer 23c are oriented in antiparallel directions.

The majority conduction electrons easily flow through the first free magnetic sub-layer 23a, and the minority conduction electrons easily flow through the second free magnetic sub-layer 23c. When the majority conduction electrons of the first free magnetic sub-layer 23a are spin up electrons, the minority conduction electrons of the second free magnetic sub-layer 23c having the magnetization direction opposite to that of the first free magnetic sub-layer 23a are also spin up electrons. Namely, with no external magnetic field applied, the spin up electrons easily flow through both the first free magnetic sub-layer 23a and the second free magnetic sub-layer 23c.

When an external magnetic field is applied, the magnetization direction of the first free magnetic sub-layer 23a relative to the pinned magnetic layers becomes different from the magnetization direction of the second free magnetic sub-layer 23c relative to the pinned magnetic layers. However, the spin up electrons have difficulty in flowing through both the first free magnetic sub-layer 23a and the second free magnetic sub-layer 23c.

Namely, both the electric resistance for the current flowing from the pinned magnetic layers to the first free magnetic sub-layer 23a through the nonmagnetic material layers and the electric resistance for the current flowing from the pinned magnetic layers to the second free magnetic sub-layer 23c through the nonmagnetic material layers are increased.

Therefore, even when the free magnetic layer 23 has the synthetic ferrimagnetic structure, a difference between the ease of a conduction electron flow in a low-resistance state and the ease of a conduction electron flow in a high-resistance state can be increased to increase the change $\Delta R$ in resistance.

Each of the pinned magnetic layers 26 may comprise either a magnetic material having a positive $\beta$ value or a magnetic material having a negative $\beta$ value.

However, the magnetic material used for forming the thickest magnetic sub-layer, i.e., the first free magnetic sub-layer 23a, among the magnetic sub-layers constituting the free magnetic layer 23 preferably has a $\beta$ value with the same positive or negative sign as that of the magnetic material used for forming the pinned magnetic layers 26 because a flow of conduction electrons in a low-resistance state can be facilitated to increase the change $\Delta R$ in resistance.

Also, when a nonmagnetic layer comprising a nonmagnetic material is laminated on a magnetic layer comprising a magnetic material, an interfacial resistance occurs at the interface between the magnetic layer and the nonmagnetic layer.

The value of interfacial resistance for the majority conduction electrons is also different from that for the minority conduction electrons.

Assuming that $r\downarrow$ represents an interfacial resistance for the minority conduction electrons, and $r\uparrow$ represents an interfacial resistance for the majority conduction electrons, a value $\gamma$ characteristic of a combination of a magnetic material land a nonmagnetic material can be defined by the following relationship:

$$r\downarrow/r\uparrow=(1+\gamma)/(1-\gamma)\ (-1\leq\gamma\leq 1)$$

Namely, when the $\gamma$ value is positive ($\gamma>0$), the relation $r\downarrow>r\uparrow$ is established, and the majority conduction electrons easily flow through the interface. On the other hand, when the $\gamma$ value is negative ($\gamma<0$), the relation $r\downarrow<r\uparrow$ is established, and the minority conduction electrons easily flow through the interface.

In this embodiment, at the interface between the second free magnetic sub-layer 23c and the nonmagnetic intermediate sub-layer 23b, the positive or negative sign of $\gamma$ is preferably equal to that of $\beta$ of the second free magnetic sub-layer 23c because a flow of conduction electrons in a low-resistance state can be facilitated to increase the change $\Delta R$ in resistance.

In this embodiment, the magnetic material of the second free magnetic sub-layer 23c has a negative $\beta$ value. The nonmagnetic intermediate sub-layer 23b comprises a nonmagnetic material composed of at least one element selected from Ru, Cr, Rh, Ir, and Os so that the $\gamma$ value at the interface between the second free magnetic sub-layer 23c and the nonmagnetic intermediate sub-layer 23b is negative.

When the nonmagnetic intermediate sub-layer 23*b* has a laminated structure of a Cu layer and a nonmagnetic material layer composed of at least one element selected from Ru, Cr, Rh, Ir, and Os, the γ value at the interface between the first free magnetic sub-layer 23*a* and the nonmagnetic intermediate sub-layer 23*b* can be made positive, and the γ value at the interface between the second free magnetic sub-layer 23*c* and the nonmagnetic intermediate sub-layer 23*b* can be made negative.

Figure 8:
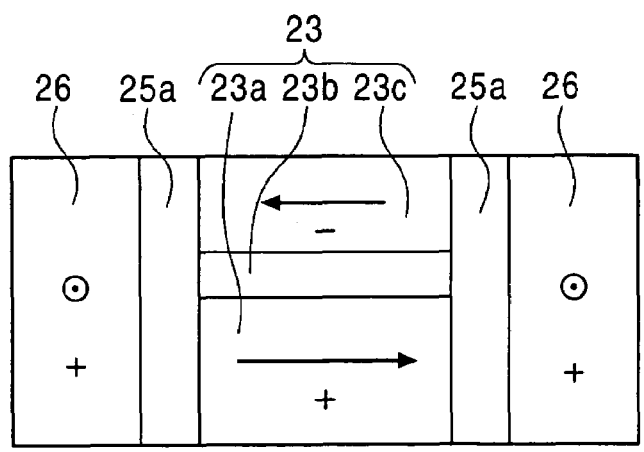
FIG. 8 is a schematic view showing an example of a combination of the magnetization directions and the signs of β of magnetic materials of a free magnetic layer and a pinned magnetic layer in a magnetic detecting element of the present invention.

FIG. 8 schematically shows a relation between the sign of β of the magnetic material and the magnetization direction of each of the first free magnetic sub-layer 23*a* and the second free magnetic sub-layer 23*c* of the free magnetic layer 23 and a relation between the sign of β of the magnetic material and the magnetization direction of each of the pinned magnetic layers 26.

Figure 9:
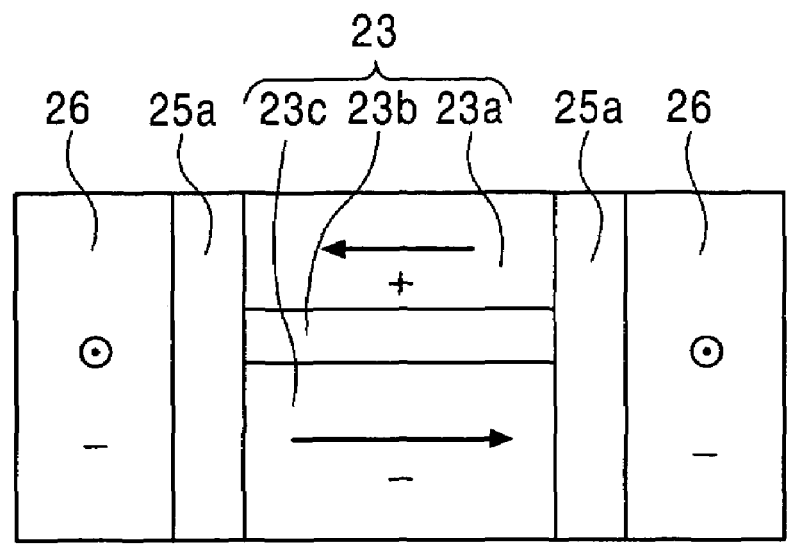
FIG. 9 is a schematic view showing an example of a combination of the magnetization directions and the signs of β of magnetic materials of a free magnetic layer and a pinned magnetic layer in a magnetic detecting element of the present invention.

As schematically shown in FIG. 9, in the free magnetic layer 23, the first free magnetic sub-layer 23*a* may be laminated on the second free magnetic sub-layer 23*c*. Also, each of the second free magnetic sub-layer 23*c* of the free magnetic layer 23 and the pinned magnetic layers 26 may comprise an alloy belonging to group B, and the first free magnetic sub-layer 23*a* of the free magnetic layer 23 may comprise an alloy belonging to group A. In this case, the magnetic material used for forming each of the second free magnetic sub-layer 23*c* of the free magnetic layer 23 and the pinned magnetic layers 26 has a negative β value, and the material used for forming the first free magnetic sub-layer 23*a* of the free magnetic layer 23 has a positive β value. In FIG. 9, the magnetization direction of each of the magnetic layers is shown by an arrow.

Figure 10:
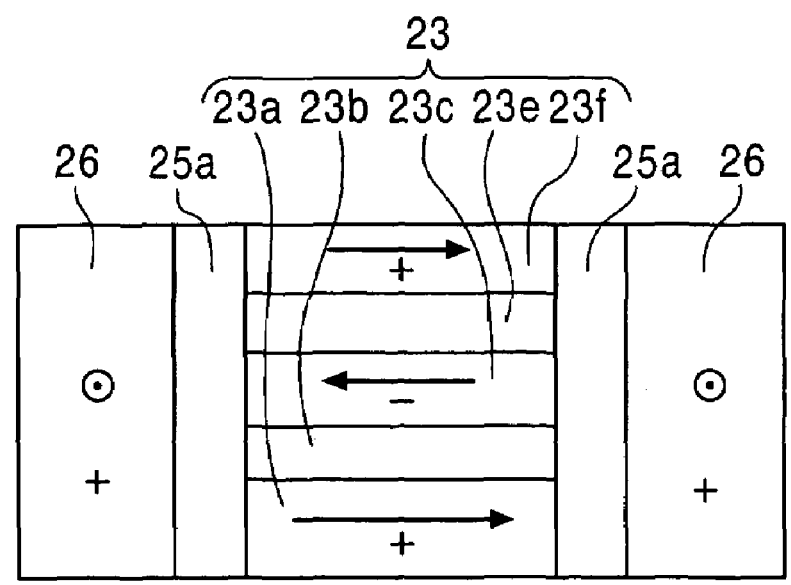
FIG. 10 is a schematic view showing an example of a combination of the magnetization directions and the signs of β of magnetic materials of a free magnetic layer and a pinned magnetic layer in a magnetic detecting element of the present invention.

As shown in FIG. 10, the free magnetic layer 23 may have a synthetic ferrimagnetic structure including a first free magnetic sub-layer 23*a*, a nonmagnetic intermediate sub-layer 23*b*, a second free magnetic sub-layer 23*c*, a nonmagnetic intermediate sub-layer 23*e*, and a third magnetic layer 23*f* which are laminated in that order.

The magnetic thickness decreases in the order of the first free magnetic sub-layer 23*a*, the second free magnetic sub-layer 23*c*, and the third magnetic layer 23*f*. Also, the thickness decreases in the order of the first free magnetic sub-layer 23*a*, the second free magnetic sub-layer 23*c*, and the third magnetic layer 23*f*.

In FIG. 10, each of the pinned magnetic layers 26 comprises an alloy belonging to group A, i.e., a magnetic material having a positive β value. The first free magnetic sub-layer 23*a* which is thickest among the magnetic sub-layers constituting the free magnetic layer 23 comprises an alloy belonging to the same group A as that of the pinned magnetic layers 26, the second free magnetic sub-layer 23*c* facing the first free magnetic sub-layer 23*a* through the nonmagnetic intermediate sub-layer 23*b* comprises an alloy (β<0) belonging to group B, and the third free magnetic layer 23*f* facing the second free magnetic sub-layer 23*c* through the nonmagnetic intermediate sub-layer 23*e* comprises an alloy (β>0) belonging to group A. In FIG. 10, the magnetization direction of each magnetic layer is shown by an arrow.

In the combination of the magnetic materials and the magnetization directions shown in FIG. 9 or 10, a difference between the ease of a conduction electron flow in a low-resistance state and the ease of a conduction electron flow in a high-resistance state can be increased to increase the change ΔR in resistance.

Alternatively, the resistivity of the magnetic material for forming the second free magnetic sub-layer 23*c* of the free magnetic layer 23 may be higher than that of the magnetic material for forming the first free magnetic sub-layer 23*a*.

Specifically, the first free magnetic sub-layer 23*a* comprises a NiFe alloy or a CoFe alloy, and the second free magnetic sub-layer 23*c* comprises a NiFeX alloy (wherein X is one element selected from Nb, Zr, Ti, Hf, Ta, Mo, W, Rh, Cr, Ru, Pt, Ir, and Sb), a CoT alloy (wherein T is one element selected from Al, Si, Ti, V, Cr, Mn, Zr, Nb, Mo, Ru, Rh, Hf, Ta, W, Re, and Ir), or a CoFeT alloy (wherein T is one element selected from Al, Si, Ti, V, Cr, Mn, Zr, Nb, Mo, Ru, Rh, Hf, Ta, W, Re, and Ir).

When the resistivity of the second free magnetic sub-layer 23*c* magnetized in the direction antiparallel to the magnetization direction of the first free magnetic sub-layer 23*a* is increased to inhibit a conductive electron flow of the sense current, a change in the electric resistance for the current flowing from the pinned magnetic layers 26 to the first free magnetic sub-layer 23*a* through the nonmagnetic material layers 25 can be prevented from being canceled by a change in the electric resistance for the current flowing from the pinned magnetic layers 26 to the second free magnetic sub-layer 23*c* through the nonmagnetic material layers 25. Therefore, the change ΔR in resistance of the magnetic detecting element can be increased.

Even when the resistivity of the magnetic material for forming the first free magnetic sub-layer 23*a* of the free magnetic layer 23 is higher than that of the magnetic material for forming the second free magnetic sub-layer 23*c*, the same effect as described above can be obtained.

When the absolute value of β of the magnetic material for forming the second free magnetic sub-layer 23*c* is smaller than that of the magnetic material for forming the first magnetic sub-layer 23*a*, the resistivity for the minority or majority conduction electrons of the second free magnetic sub-layer 23*c* magnetized in the direction antiparallel to the magnetization direction of the first free magnetic sub-layer 23*a* can be increased to inhibit the conduction electron flow of the sense current.

In this case, the β value is characteristic of a magnetic material satisfying the relationship $\rho\downarrow/\rho\uparrow=(1+\beta)/(1-\beta)$ $(-1\leq\beta\leq1)$ (wherein $\rho\downarrow$ represents resistivity for minority conduction electrons, and $\rho\uparrow$ represents resistivity for majority conduction electrons).

When the absolute value of β of the magnetic material for forming the second free magnetic sub-layer 23*c* is smaller than that of the magnetic material for forming the first free magnetic sub-layer 23*a*, a change in the electric resistance for the current flowing from the pinned magnetic layers 26 to the first free magnetic sub-layer 23*a* through the nonmagnetic material layers 25 can be prevented from being canceled by a change in the electric resistance for the current flowing from the pinned magnetic layers 26 to the second free magnetic sub-layer 23*c* through the nonmagnetic material layers 25. Therefore, the change ΔR in resistance of the magnetic detecting element can be increased.

Specifically, the first free magnetic sub-layer 23*a* comprises a NiFe alloy or a CoFe alloy, and the second free magnetic sub-layer 23*c* comprises a NiFeX alloy (wherein X is one element selected from Nb, Zr, Ti, Hf, Ta, Mo, W, Rh, Cr, Ru, Pt, Ir, and Sb), a CoT alloy (wherein T is one element selected from Al, Si, Ti, V, Cr, Mn, Zr, Nb, Mo, Ru, Rh, Hf, Ta, W, Re, and Ir), or a CoFeT alloy (wherein T is one element selected from Al, Si, Ti, V, Cr, Mn, Zr, Nb, Mo, Ru, Rh, Hf, Ta, W, Re, and Ir). In this case, the absolute value of β of the magnetic material for forming the second free magnetic sub-layer 23c can be made smaller than that of the magnetic material for forming the first free magnetic sub-layer 23a.

Even when the absolute value of β of the magnetic material for forming the first free magnetic sub-layer 23a is smaller than that of the magnetic material for forming the second free magnetic sub-layer 23c, the same effect as described above can be obtained.

Although, in the above-described embodiment, each of the first free magnetic sub-layer 23a and the second free magnetic sub-layer 23c of the free magnetic layer 23, and the pinned magnetic layers 26 is a single magnetic layer, another magnetic layer comprising a magnetic material having the same positive or negative sign of β may be laminated on each of these magnetic layers.

The free magnetic layer 23 may be formed in any synthetic ferrimagnetic structure including the first free magnetic sub-layer 23a and the second free magnetic sub-layer 23c each comprising the above-described magnetic material. For example, a CoFe layer may be provided between the first free magnetic sub-layer 23a and the nonmagnetic intermediate sub-layer 23b and between the second free magnetic sub-layer 23c and the nonmagnetic intermediate sub-layer 23b to strengthen the RKKY interaction between the first free magnetic sub-layer 23a and the second free magnetic sub-layer 23c.

A method for supplying a longitudinal bias magnetic field to the free magnetic layer 23 will be described.

In the magnetic detecting element shown in FIG. 1, the hard bias layers 29 comprising Co—Pt are disposed on the outsides of the pinned magnetic layers 26 so that a longitudinal bias magnetic field is applied to the free magnetic layer 23 from each hard bias layer 29 in the X direction.

The hard bias layers 29 are formed on the respective bias underlying layers 28. Each of the bias underlying layers 28 preferably comprises a metal film having a body-centered cubic structure (bcc) with (100) orientation.

Examples of metal films having a body-centered cubic crystal structure with (100) orientation includes films of Cr (chromium), Ti (titanium), Mo (molybdenum), W (tungsten), and $W_{50}Mo_{50}$ (atomic %). Each of the bias underlying layers 28 may comprise one of these materials or a mixture of at least two materials.

When the hard bias layers 29 comprising a CoPt alloy are formed on the respective bias underlying layers 28 comprising Cr having a body-centered cubic structure with (100) orientation, the coercive force Hc and the remanence ratio S of residual magnetization (Br)/saturation magnetic flux density (Bs) of the hard bias layers 29 are increased. As a result, a bias magnetic field produced each the hard bias layers 29 is increased.

In the magnetic detecting element shown in FIG. 1, a static magnetic field produced from the hard bias layers 29 exerts on the free magnetic layer 23 beyond the pinned magnetic layers 26. Therefore, when the width dimension L1 of each pinned magnetic layer 26 in the X direction (track width direction) is excessively large, a longitudinal bias magnetic field of proper magnitude cannot be applied to the free magnetic layer 23. Specifically, the width dimension L1 of each pinned magnetic layer 26 in the X direction (track width direction) is set to about 50 angstroms so that a longitudinal bias magnetic field of proper magnitude can be applied to the free magnetic layer 23. Even when the width dimension L1 of each pinned magnetic layer 26 in the X direction (track width direction) is about 50 angstroms, the exchange anisotropic magnetic field produced between each pinned magnetic layer 26 and the antiferromagnetic layer 27 can be increased by using the above-described antiferromagnetic material for the antiferromagnetic layers 27. Therefore, magnetization of each pinned magnetic layer 26 can be strongly pinned to prevent the magnetization direction of each pinned magnetic layer 26 from fluctuating due to the static magnetic field produced from each hard bias layer 29.

Figure 2:
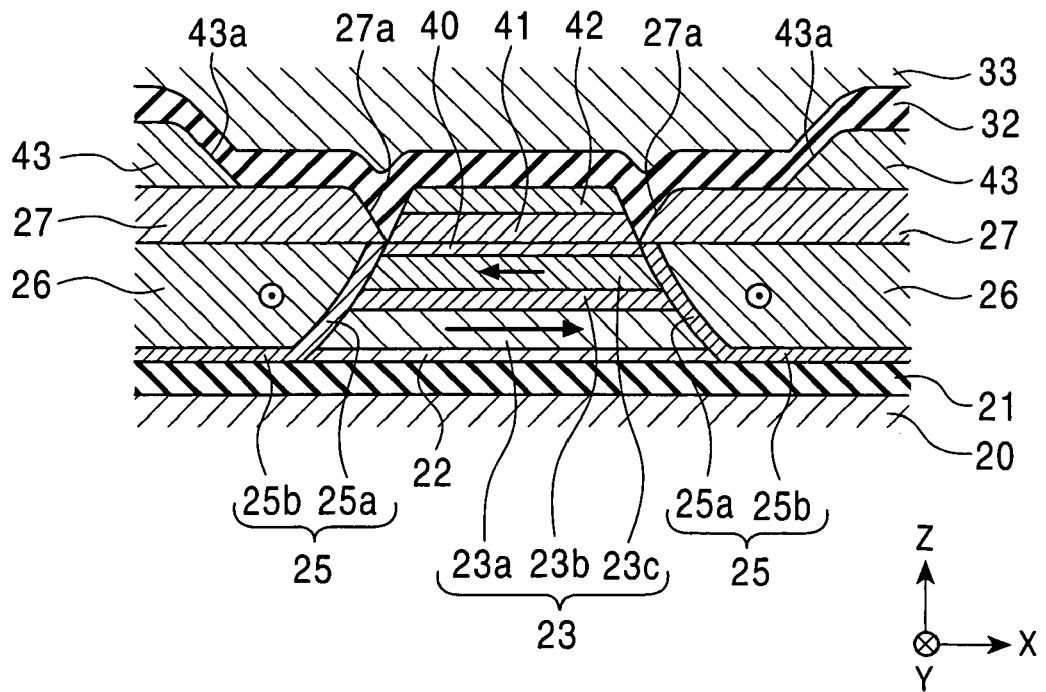
FIG. 2 is a sectional view showing a magnetic detecting element according to a second embodiment of the present invention.

FIG. 2 is a partial sectional view showing the structure of a magnetic detecting element according to a second embodiment of the present invention, as viewed from a surface facing a recording medium. In FIG. 2, a layer denoted by the same reference numeral as in FIG. 1 comprises the same material and has the same thickness and shape as those of the corresponding layer shown in FIG. 1 unless otherwise specified.

The magnetic detecting element shown in FIG. 2 is different from that shown in FIG. 1 in that hard bias layers are not formed on the outsides of the respective pinned magnetic layers 26, but a ferromagnetic layer 41 and an antiferromagnetic layer 42 are laminated on the free magnetic layer 23 through a separating layer 40 comprising alumina.

An exchange anisotropic magnetic field is produced at the interface between the ferromagnetic layer 41 and the antiferromagnetic layer 42 to pin magnetization of the ferromagnetic layer 41 in the X direction shown in the drawing. Furthermore, magnetostatic coupling occurs between the ferromagnetic layer 41 and the second free magnetic sub-layer 23c near the ferromagnetic layer 41. As a result, magnetization of the second free magnetic sub-layer 23c is put into a single magnetic domain state in the direction antiparallel to the X direction, and magnetization of the first magnetic sub-layer 23a is oriented in the X direction.

In this case, the magnetic moment (saturation magnetization Ms×thickness t) per unit area of the second free magnetic sub-layer 23c is set to be larger that that of the first free magnetic sub-layer 23a, for stabilizing a longitudinal bias. Also, preferably, the positive or negative sign of β of the pinned magnetic layers 26 is the same as that of the second free magnetic sub-layer 23c, and the positive or negative sign of β of the second free magnetic sub-layer 23c is different from that of the first free magnetic sub-layer 23a.

Figure 3:
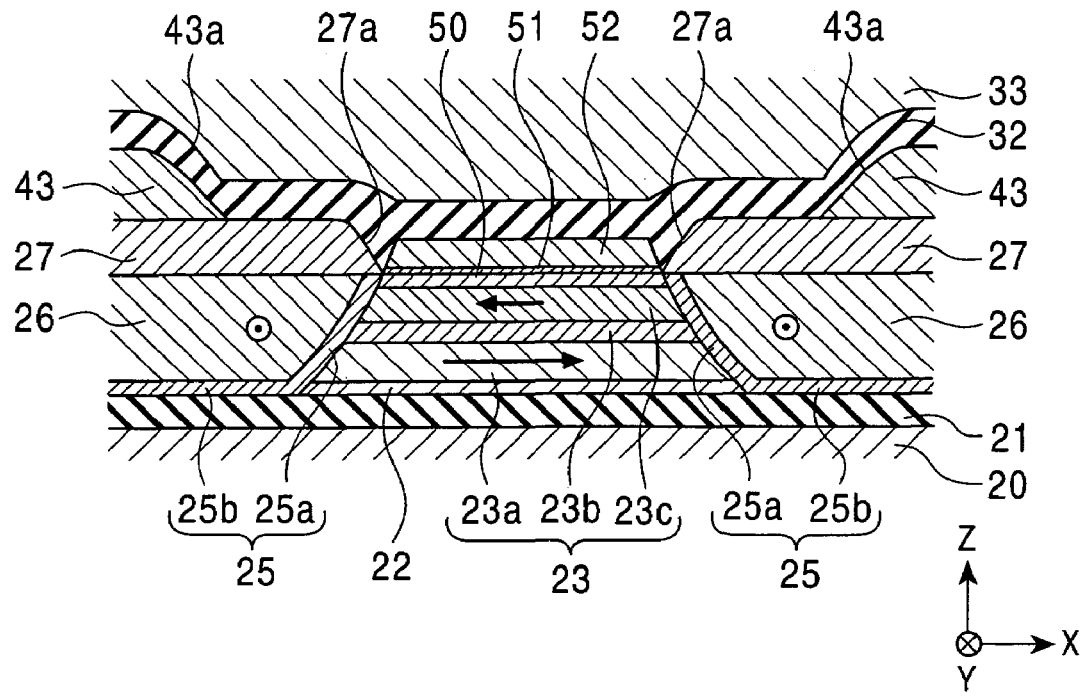
FIG. 3 is a sectional view showing a magnetic detecting element according to a third embodiment of the present invention.

FIG. 3 is a partial sectional view showing the structure of a magnetic detecting element according to a third embodiment of the present invention, as viewed from a surface facing a recording medium. In FIG. 3, a layer denoted by the same reference numeral as in FIG. 1 comprises the same material and has the same thickness and shape as those of the corresponding layer shown in FIG. 1 unless otherwise specified.

The magnetic detecting element shown in FIG. 3 is different from that shown in FIG. 1 in that hard bias layers are not formed on the outsides of the respective pinned magnetic layers 26, but an underlying layer 51 and a hard magnetic layer 52 are laminated on the free magnetic layer 23 through a separating layer 50 comprising alumina.

The underlying layer 51 comprises Cr, Ta or a Ta/Cr laminated film, and the hard magnetic layer 52 comprises Co—Pt. The hard magnetic layer 52 is magnetized in the X direction. Furthermore, magnetostatic coupling occurs between the hard magnetic layer 52 and the second free magnetic sub-layer 23c of the free magnetic layer 23 near the hard magnetic layer 52. As a result, magnetization of the second free magnetic sub-layer 23c is put into a single magnetic domain state in the direction antiparallel to the X direction, and magnetization of the first magnetic sub-layer 23a is oriented in the X direction.

In this case, the magnetic moment (saturation magnetization Msx thickness t) per unit area of the second free magnetic sub-layer 23c is set to be larger that that of the first free magnetic sub-layer 23a, for stabilizing a longitudinal bias. Also, preferably, the positive or negative sign of β of the pinned magnetic layers 26 is the same as that of the second free magnetic sub-layer 23c, and the positive or negative sign of β of the second free magnetic sub-layer 23c is different from that of the first free magnetic sub-layer 23a. The longitudinal bias system of the magnetic detecting elements shown in FIGS. 2 and 3 is referred to as an "in-stack bias system". In the in-stack bias system, the magnetization of the free magnetic layer is strongly pinned near the end surfaces to suppress the occurrence of a dead zone in which magnetic reversal deteriorates. Single-magnetic-domain formation in the free magnetic layer can be properly promoted to improve magnetic reversal of the free magnetic layer with an external magnetic field. Therefore, a magnetic detecting element having high reproduction sensitivity and reproduction waveform with excellent stability can be manufactured.

In the magnetic detecting element shown in FIG. 2 or 3, both end surfaces of the free magnetic layer 23 and both end surfaces of the separating layer 40 or 50 and the ferromagnetic layer 41 or the hard magnetic layer 52 in the track width direction are formed as a continuous surface. Thus, magnetostatic coupling between the free magnetic layer 23 and the ferromagnetic layer 41 or the hard magnetic layer 52 can be improved to promote single-magnetic-domain formation in the free magnetic layer 23.

The thickness of the ferromagnetic layer 41 or the hard magnetic layer 52 is preferably 50 Å to 300 Å.

Figure 4:
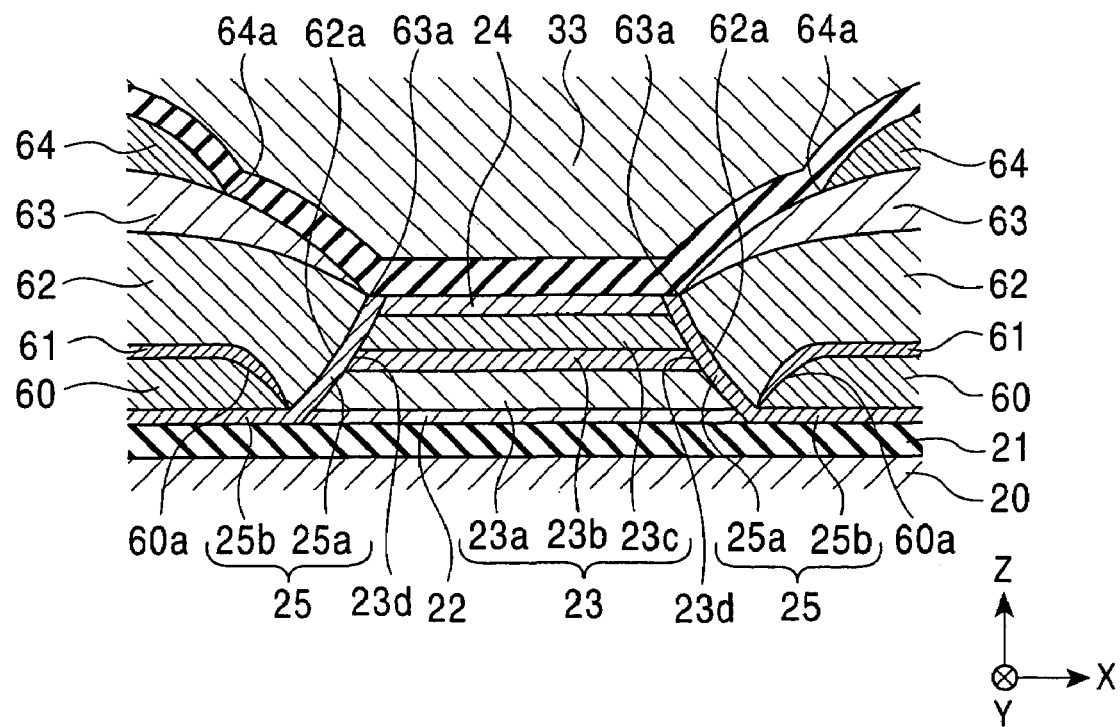
FIG. 4 is a sectional view showing a magnetic detecting element according to a fourth embodiment of the present invention.

FIG. 4 is a partial sectional view showing the structure of a magnetic detecting element according to a fourth embodiment of the present invention, as viewed from a surface facing a recording medium. In FIG. 4, a layer denoted by the same reference numeral as in FIG. 1 comprises the same material and has the same thickness and shape as those of the corresponding layer shown in FIG. 1 unless otherwise specified.

The magnetic detecting element shown in FIG. 4 is different from that shown in FIG. 1 in that separating layers 61 comprising a nonmagnetic material, pinned magnetic layers 62, antiferromagnetic layers 63 and electrode layers 64 are laminated in that order on respective hard bias layers 60 formed on both sides of the free magnetic layer 23.

Each of the hard bias layers 60 has an inclined or curved inner end surface 60a. Therefore, the thickness of each hard bias layer 60 gradually decreases nearer to the free magnetic layer 23. With the hard bias layers 60 each having such a tapered shape, the joint area between the inner end surface 62a of each pinned magnetic layer 62 and the interstitial portion 25a of the corresponding nonmagnetic material layer 25 can be increased to increase a change in magnetoresistance.

In the magnetic detecting element shown in FIG. 4, the hard bias layers 60 can be provided near the free magnetic layer 23, and thus the free magnetic layer 23 can be easily appropriately put into a single magnetic domain state, as compared with the magnetic detecting element of the structure shown in FIG. 1.

In the magnetic detecting element shown in FIG. 4, specular layers or insulating layers, which will be described below, are respectively provided between the hard bias layers 60 and the pinned magnetic layers 62. In this case, a shunt loss of the sense current to the hard bias layers 60 can be decreased, and a change in magnetoresistance can be increased.

Figure 5:
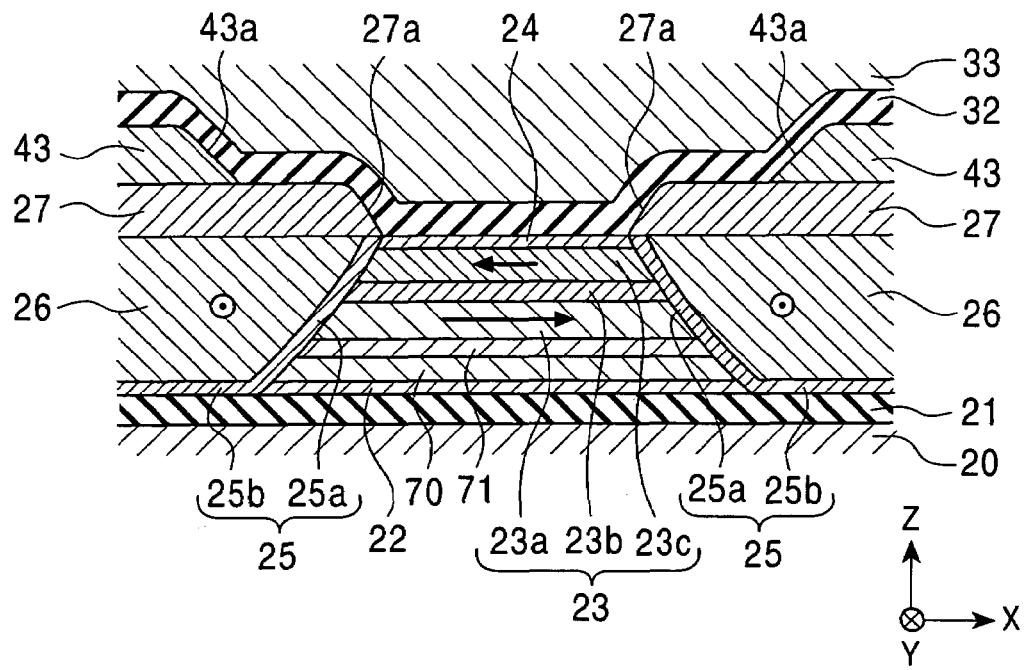
FIG. 5 is a sectional view showing a magnetic detecting element according to a fifth embodiment of the present invention.

FIG. 5 is a partial sectional view showing the structure of a magnetic detecting element according to a fifth embodiment of the present invention, as viewed from a surface facing a recording medium. In FIG. 5, a layer denoted by the same reference numeral as in FIG. 1 comprises the same material and has the same thickness and shape as those of the corresponding layer shown in FIG. 1 unless otherwise specified.

The magnetic detecting element shown in FIG. 5 is different from that shown in FIG. 1 in that hard bias layers are not formed on the outsides the respective pinned magnetic layers 26, but an antiferromagnetic layer 70 is provided below the free magnetic layer 23 through a nonmagnetic layer 71.

The nonmagnetic layer 71 comprises Cu or Ru, and the antiferromagnetic layer 70 comprises the same material as the antiferromagnetic layers 27, for example, a PtMn alloy. Also, an indirect exchange coupling magnetic field (long range exchange coupling) occurs between the first free magnetic sub-layer 23a of the free magnetic layer 23 and the antiferromagnetic layer 70 through the nonmagnetic layer 71. As result, magnetization of the first free magnetic sub-layer 23a is put into a single magnetic domain state in the X direction, and magnetization of the second free magnetic sub-layer 23c is oriented in the direction antiparallel to the X direction. Since the nonmagnetic layer 71 is interposed between the first free magnetic sub-layer 23a of the free magnetic layer 23 and the antiferromagnetic layer 70, the exchange coupling magnetic field can be properly weakened. Therefore, the free magnetic layer 23 can be put into a single magnetic domain state, and magnetization rotation can be facilitated.

Although, in FIG. 5, the antiferromagnetic layer 70 is provided below the free magnetic layer 23 through the nonmagnetic layer 71, the antiferromagnetic layer may be provided above the free magnetic layer 23 through the nonmagnetic layer.

Figure 6:
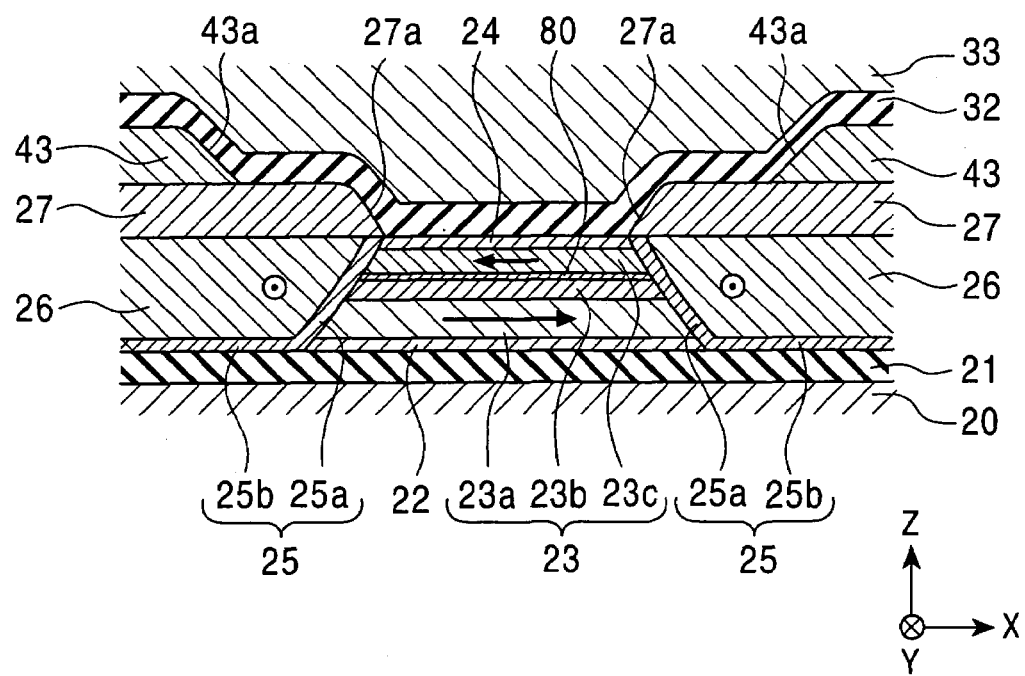
FIG. 6 is a sectional view showing a magnetic detecting element according to a sixth embodiment of the present invention.

FIG. 6 is a partial sectional view showing the structure of a magnetic detecting element according to a sixth embodiment of the present invention, as viewed from a surface facing a recording medium. In FIG. 6, a layer denoted by the same reference numeral as in FIG. 1 comprises the same material and has the same thickness and shape as those of the corresponding layer shown in FIG. 1 unless otherwise specified.

The magnetic detecting element shown in FIG. 6 is different from that shown in FIG. 1 in that a specular layer 80 is provided between the second free magnetic sub-layer 23c and the nonmagnetic intermediate sub-layer 23b of the free magnetic layer 23, for reflecting (specular reflection) the conduction electrons of the sense current while maintaining the spin direction thereof. The specular layer 80 may have defects (pin holes).

As shown in FIG. 6, when the specular layer 80 is formed in the free magnetic layer 23, the conduction electrons reaching the specular layer 80 are specularly reflected by the specular layer 80 while maintaining the spin state (energy, quantum state, etc.). The moving direction of the conduction electrons specularly reflected by the specular layer 80 is changed so that the conduction electrons can pass through the free magnetic layer 23.

Therefore, the mean free path λ of the conduction electrons having spin (for example, spin up) contributing to magnetoresistance can be lengthened by providing the specular layer 80 to increase a difference between the mean free path of spin-up conduction electrons and that of spin-down conduction electrons, as compared with a conventional magnetic detecting element. Therefore, the rate (ΔR/R) of resistance change can be increased, and reproduction output can also be improved.

For example, after the nonmagnetic intermediate sub-layer 23b of the free magnetic layer 23 is deposited, the nonmagnetic intermediate sub-layer 23b is oxidized so that the oxidized layer can function as the specular layer 80. Then, the magnetic layer 23c is deposited on the specular layer 80.

The specular layer 80 may be provided in the magnetic sub-layer 23a or the magnetic sub-layer 23c, below the magnetic sub-layer 23a, above the magnetic sub-layer 23c, or between the magnetic sub-layer 23a and the nonmagnetic intermediate sub-layer 23b. In this case, the magnetic sub-layer 23a or the magnetic sub-layer 23c may be oxidized so that the oxidized layer can function as the specular layer 80.

Examples of a material for the specular layer 80 include oxides such as Fe—O, Ni—O, Co—O, Co—Fe—O, Co—Fe—Ni—O, Al—O, Al—Q—O (wherein Q is at least one element selected from B, Si, N, Ti, V, Cr, Mn, Fe, Co, and Ni), and R—O (wherein R is at least one element selected from Cu, Ti, V, Cr, Zr, Nb, Mo, Hf, Ta, and W); nitrides such as Al—N, Al—Q—N (wherein Q is at least one element selected from B, Si, O, Ti, V, Cr, Mn, Fe, Co, and Ni), and R—N (wherein R is at least one element elected from Ti, V, Cr, Zr, Nb, Mo, Hf, Ta, and W); semimetal whistler alloys; and the like.

In depositing the specular layer 80 by sputtering, for example, the temperature of a substrate on which the magnetic detecting element is formed is 0 to 100° C., the distance between the substrate and a material target for the specular layer 80 is 100 mm to 300 mm, and the Ar gas pressure is $10^{-5}$ to $10^{-3}$ Torr ($1.3 \times 10^{-3}$ to 0.13 Pa).

Figure 7:
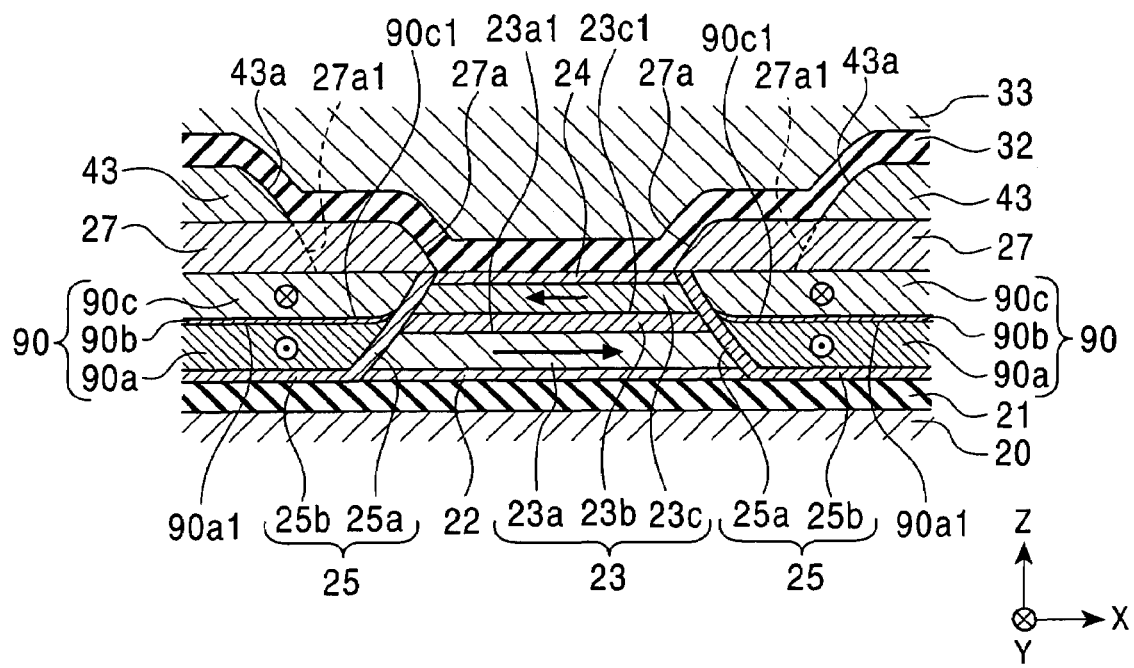
FIG. 7 is a sectional view showing a magnetic detecting element according to a seventh embodiment of the present invention.

FIG. 7 is a partial sectional view showing the structure of a magnetic detecting element according to a seventh embodiment of the present invention, as viewed from a surface facing a recording medium. In FIG. 7, a layer denoted by the same reference numeral as in FIG. 1 comprises the same material and has the same thickness and shape as those of the corresponding layer shown in FIG. 1 unless otherwise specified.

The magnetic detecting element shown in FIG. 7 is different from that shown in FIG. 1 in that pinned magnetic layers 90 are formed instead of the pinned magnetic layers 26, each pinned magnetic layer 90 having a synthetic ferrimagnetic structure including magnetic layers 90a and 90c which are laminated with a nonmagnetic intermediate sub-layer 90b provided therebetween.

An exchange coupling magnetic field occurs at the interface between each magnetic layer 90c and the antiferromagnetic layer 27 to pin magnetization of each magnetic layer 90c in the Y direction (height direction) shown in the drawing. Also, magnetization of each magnetic layer 90a is pinned in the direction antiparallel to the Y direction by a RKKY interaction between the magnetic layers 90a and 90c through the nonmagnetic intermediate sub-layer 90b.

When each of the pinned magnetic layers 90 has the synthetic ferrimagnetic structure, magnetization of each pinned magnetic layer can be strongly pinned in one direction. Therefore, even when the magnetic layer 90c of each pinned magnetic layer 90 is not completely covered with the antiferromagnetic layer 27, magnetization of each pinned magnetic layer 90 can be sufficiently strongly pinned. Thus, the inner end surface 27a of each antiferromagnetic layer 27 can be disposed at a position 27a1 shown by a dotted line apart from the free magnetic layer 23. When the inner end surface 27a of each antiferromagnetic layer 27 is provided apart from the free magnetic layer 23, a shunt loss of the sense current can be decreased.

When both the free magnetic layer 23 and the pinned magnetic layers 90 respectively have the synthetic ferrimagnetic structures, as shown in FIG. 7, the magnetic layer 23c formed on the nonmagnetic intermediate sub-layer 23b of the free magnetic layer 23 and the magnetic layer 90c formed on the nonmagnetic intermediate sub-layer 90b of each pinned magnetic layer 90 preferably comprise magnetic materials having the same positive or negative sing of β, and the magnetic sub-layer 23a formed below the nonmagnetic intermediate sub-layer 23b of the free magnetic layer 23 and the magnetic layer 90a formed below the nonmagnetic intermediate sub-layer 90b of each pinned magnetic layer 90 preferably comprise magnetic materials having the same positive or negative sing of β. The thickness of the magnetic layers 90a and 90c of the pinned magnetic layer 90 may be any desired values. Namely, the position of the top surface 90a1 of each magnetic layer 90a may be slightly higher (the Z direction) than that of the bottom surface 23c1 of the magnetic layer 23c of the free magnetic layer 23, or the position of the bottom surface 90c1 of the magnetic layer 90c may be slightly lower (the direction opposite to the Z direction shown in the drawing) than that of the top surface 23a1 of the magnetic sub-layer 23a of the free magnetic layer 23. However, in order to prevent an offset of changes in magnetoresistance, the position of the top surface 90a1 of each magnetic layer 90a is preferably lower than the bottom surface 23c1 of the magnetic layer 23c of the free magnetic layer 23, and the bottom surface 90c1 of each magnetic layer 90c is preferably higher than the top surface 23a1 of the magnetic sub-layer 23a of the free magnetic layer 23.

Although a bias structure for applying a longitudinal bias magnetic field to the free magnetic layer 23 is not shown in FIGS. 6 and 7, any one of the bias systems shown in FIGS. 1 to 5 may be used.

In each of the magnetic detecting elements shown in FIGS. 2, 3, 5, 6, and 7, the inner end surfaces 43a of the electrode layers 43 are disposed more apart from the free magnetic layer 23 than the inner end surfaces 27a of the antiferromagnetic layers 27. In the magnetic detecting element shown in FIG. 4, the inner edges 64a of the electrode layers 64 are provided more apart from the free magnetic layer 23 than the inner edges 63a of the antiferromagnetic layer 63. In this way, the electrode layers are provided apart from the free magnetic layer to decrease a shunt loss of the sense current.

A method for manufacturing the magnetic detecting element shown in FIG. 1 will be described.

First, the lower shield layer 20, the lower gap layer 21, the underlying layer 22, the first free magnetic sub-layer 23a, the nonmagnetic intermediate sub-layer 23b and the second free magnetic sub-layer 23c of the free magnetic layer 23, and the protective layer 24 are deposited in the form of a solid film to form a multilayer film, and then a central portion of the multilayer film is masked with a lift-off resist, for removing both side portions of the multilayer film by ion milling. The incidence angle of ion milling is, for example 70° to 90° with respect to the surface of the protective layer.

The materials for the lower shield layer 20, the lower gap layer 21, the underlying layer 22, the first free magnetic sub-layer 23a, the nonmagnetic intermediate sub-layer 23b and the second free magnetic sub-layer 23c of the free magnetic layer 23, and the protective layer 24 are the same as those described above for the structure of the magnetic detecting element shown in FIG. 1.

Figure 11:
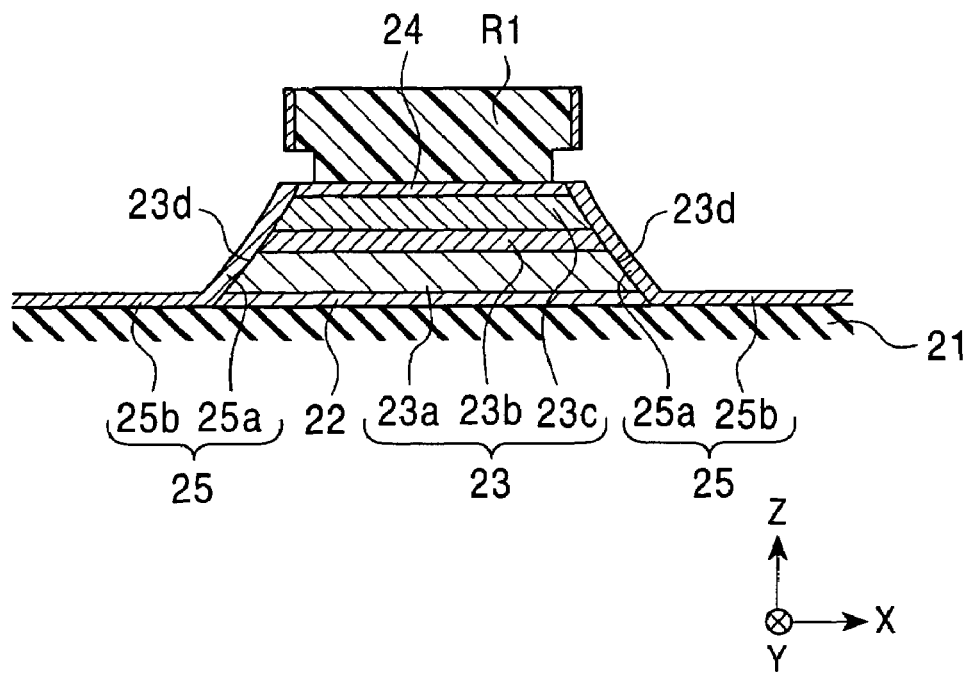
FIG. 11 is a drawing showing a step of a method for manufacturing a magnetic detecting element of the present invention.

Next, as shown in FIG. 11, the nonmagnetic material layers 25 are deposited on the end surfaces of the underlying layer 22, the first free magnetic sub-layer 23a, the nonmagnetic intermediate sub-layer 23b and the second free magnetic sub-layer 23c of the free magnetic layer 23 by sputtering Cu with the resist layer R1 remaining on the protective layer 24. As the sputtering method, any one or more of an ion beam sputtering method, a long slow sputtering method, and a collimation sputtering method may be used.

The incidence angle of sputtering for depositing the nonmagnetic material layers 25 is, for example, 30° to 70° with respect to the surface of the lower gap layer 21 (or the surface of the substrate). The incidence angle of sputtering for depositing the nonmagnetic material layers 25 is set to a small value so as to deposit the nonmagnetic material layers 25 mainly on the side ends 23d of the free magnetic layer 23 with a difficulty in depositing the nonmagnetic material layers 25 on the portions of the lower gap layer 21 exposed on both sides of the free magnetic layer 23. Therefore, the thickness of the interstitial portion 25a of the nonmagnetic material layer 25 deposited on each of the side ends 23d of the free magnetic layer 23 is larger than that of each of the extending portions 25b formed on the lower gap layer 21. The thickness of each interstitial portion 25a in the X direction is 20 Å to 50 Å. Since the extending portions 25b cause a shunt loss of the sense current without contributing to magnetoresistance, the thickness of each extending portion 25b is preferably as small as possible. After the nonmagnetic material layers 25 are formed, the extending portions 25b of the nonmagnetic material layers 25 may be removed by ion milling in a direction perpendicular to the surface of the lower gap layer 21.

Figure 12:
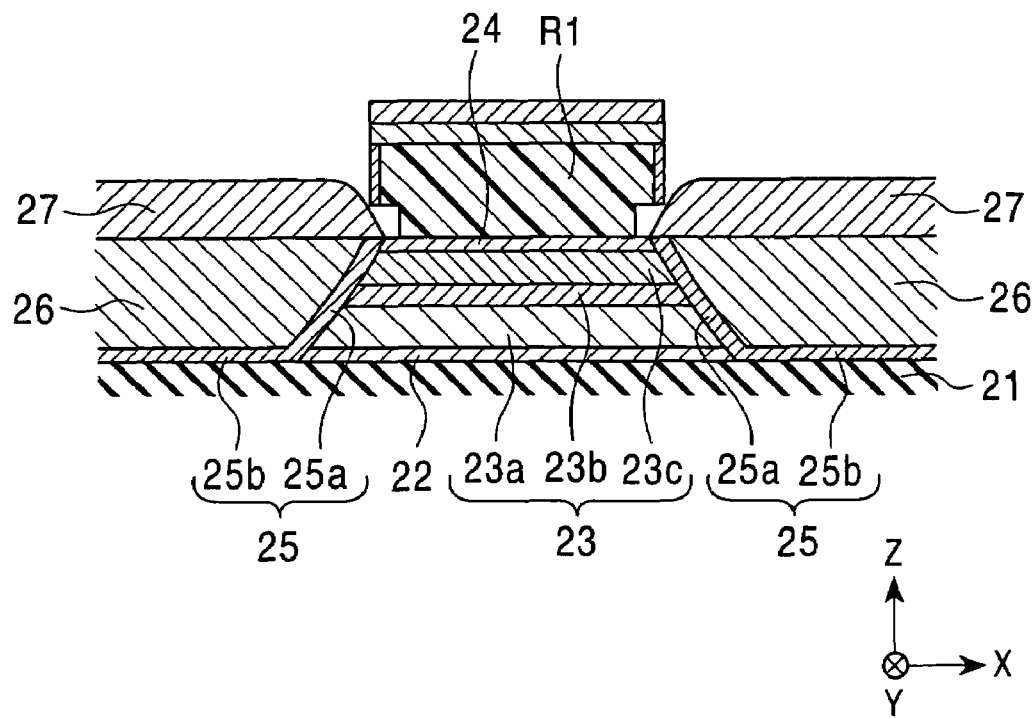
FIG. 12 is a drawing showing a step of a method for manufacturing a magnetic detecting element of the present invention.
Figure 13:
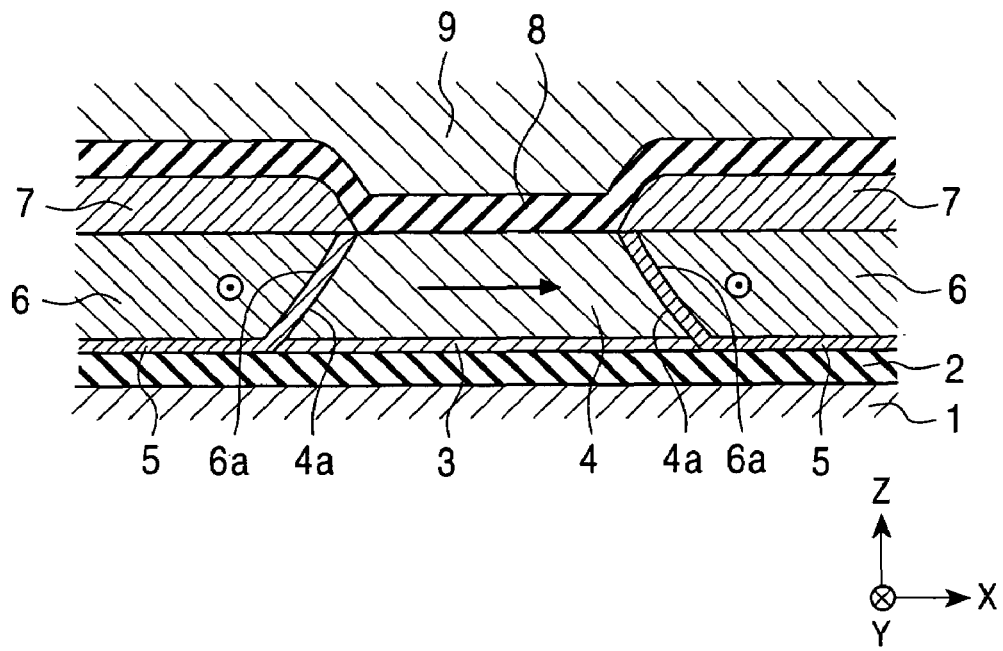
FIG. 13 is a sectional view showing a conventional magnetic detecting element.
Figure 14:
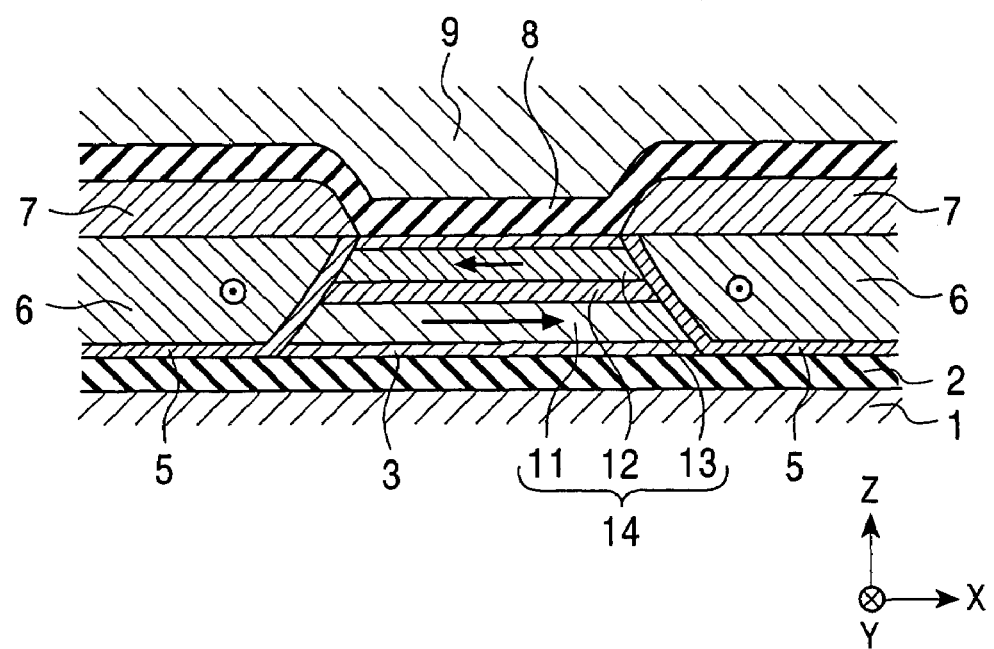
FIG. 14 is a sectional view showing a conventional magnetic detecting element.

Next, as shown in FIG. 12, the pinned magnetic layers 26 and the antiferromagnetic layers 27 are continuously deposited by sputtering with the resist layer R1 remaining on the protective layer 24. As the sputtering method, any one or more of an ion beam sputtering method, a long slow sputtering method, or a collimation sputtering method may be used. The incidence angle of sputtering for depositing the pinned magnetic layers 26 and the antiferromagnetic layers 27 is, for example, 50° to 90° with respect to the surface of the lower gap layer 21 (or the surface of the substrate).

In forming the magnetic detecting element shown in FIG. 1, the resist layer R1 is removed after the step shown in FIG. 12. Then, the dimension (element height) of the magnetic detecting element in the depth direction of the element (height direction; the Y direction shown in the drawing) is defined by patterning, and then a resist layer having a larger width dimension (the width dimension in the X direction) than that of the resist layer R1 is deposited to mask the entire surface of the free magnetic layer 23 and portions of the pinned magnetic layers 26 and the antiferromagnetic layers 27. Then, both side portions of the pinned magnetic layers 26 and the antiferromagnetic layers 27, which are not masked with the resist layer, are removed, and the bias underlying layers 28, the hard bias layers 29, the underlying layers 30 and the electrode layers 31 are deposited on both sides of the remaining pinned magnetic layers 26 and antiferromagnetic layers 27. After the resist layer is removed, the upper gap layer 32 and the upper shield layer 33 are laminated.

A heat treatment is performed in a magnetic field in the direction antiparallel to the Y direction to produce an exchange anisotropic magnetic field at the interface between each pinned magnetic layer 26 and the antiferromagnetic layer 27, and the hard bias layers 29 are magnetized in the X direction at room temperature to obtain the magnetic detecting element shown in FIG. 1.

In forming the magnetic detecting element shown in FIG. 2, the lower shield layer 20, the lower gap layer 21, the underlying layer 22, the first free magnetic sub-layer 23a, the nonmagnetic intermediate sub-layer 23b and the second free magnetic sub-layer 23c of the free magnetic layer 23, the separating layer 40, the ferromagnetic layer 41, and the antiferromagnetic layer 42 are deposited in the form of a solid film to form a multilayer film. Then, first magnetic field annealing is performed to produce an exchange anisotropic magnetic field in the X direction at the interface between the ferromagnetic layer 41 and the antiferromagnetic layer 42. Then, the same steps as those shown in FIGS. 11 and 12 are performed. Next, second magnetic field annealing is performed in a magnetic field in the direction antiparallel to the Y direction to produce an exchange anisotropic magnetic field at the interface between each pinned magnetic layer 26 and the antiferromagnetic layer 27.

In forming the magnetic detecting element shown in FIG. 3, the lower shield layer 20, the lower gap layer 21, the underlying layer 22, the first free magnetic sub-layer 23a, the nonmagnetic intermediate sub-layer 23b and the second free magnetic sub-layer 23c of the free magnetic layer 23, the separating layer 50, the underlying layer 51, and the hard magnetic layer 52 are deposited in the form of a solid film to form a multilayer film. Then, the same steps as those shown in FIGS. 11 and 12 are performed.

In forming the magnetic detecting element shown in FIG. 4, the same step as that shown in FIG. 11 is performed, and then the hard bias layers 60, the separating layers 61, the pinned magnetic layers 62, the antiferromagnetic layers 63 and the electrode layers 64 are deposited.

In forming the magnetic detecting element shown in FIG. 5, the lower shield layer 20, the lower gap layer 21, the underlying layer 22, the antiferromagnetic layer 70, nonmagnetic layer 71, the first free magnetic sub-layer 23a, the nonmagnetic intermediate sub-layer 23b and the second free magnetic sub-layer 23c of the free magnetic layer 23, and the protective layer 24 are deposited in the form of a solid film to form a multilayer film. Then, the same steps as those shown in FIGS. 11 and 12 are performed.

Figure 15:
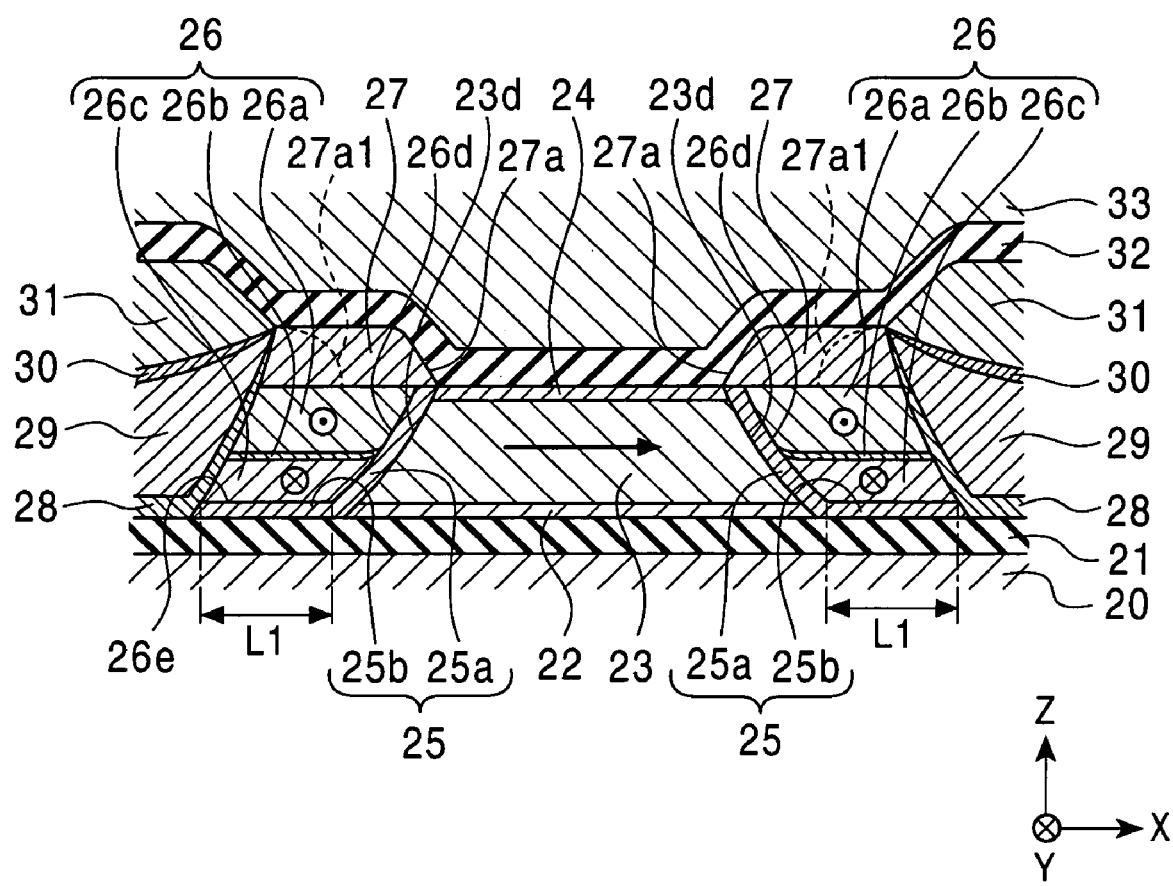
FIG. 15 is a sectional view showing a magnetic detecting element according to an eighth embodiment of the present invention.

FIG. 15 is a partial sectional view showing the structure of a magnetic detecting element according to an eighth embodiment of the present invention, as viewed from a surface facing a recording medium.

In FIG. 15, reference numeral 20 denotes a lower shield layer comprising a magnetic material such as NiFe or the like. A lower gap layer 21 comprising an insulating material such as alumina or the like is formed on the lower shield layer 20.

Also, a free magnetic layer 23 is formed in a substantially trapezoidal shape on the lower gap layer 21 through an underlying layer 22 comprising Cr or Ta. The track width of the magnetic detecting element is defined by the width dimension (dimension in the track width direction) of the free magnetic layer 23 in the X direction shown in the drawing. In this embodiment, the track width of the magnetic detecting element is 0.1 μm or less.

In the magnetic detecting element shown in FIG. 15, a nonmagnetic material layer 25 comprising Cu is formed to extend from each end surface 23d of the free magnetic layer 23 to each of both side portions of the lower gap layer 21 on both sides of the free magnetic layer 23. Furthermore, pinned magnetic layers 26 comprising a soft magnetic material are formed in contact with the respective nonmagnetic material layers 25. Namely, the free magnetic layer 23 faces the pinned magnetic layers 26 through the interstitial portions 25a of the nonmagnetic material layers 25.

Each of the pinned magnetic layers 26 has a synthetic ferrimagnetic structure including a first pinned magnetic sub-layer 26a and a second pinned magnetic sub-layer 26c each comprising a soft magnetic material, the first and second pinned magnetic sub-layers 26a and 26c being laminated with a nonmagnetic intermediate sub-layer 26b provided therebetween.

Furthermore, an antiferromagnetic layer 27 is laminated on each of the pinned magnetic layers 26 so that an exchange coupling magnetic field is produced at each of the interfaces between the first pinned magnetic sub-layers 26a and the antiferromagnetic layers 27 to pin the magnetization direction of each first pinned magnetic sub-layer 26a in the direction antiparallel to the Y direction shown in the drawing. Also, the magnetization direction of each second pinned magnetic sub-layer 26c is pinned in the Y direction due to a RKKY interaction between the second pinned magnetic sub-layer 26c and the first pinned magnetic sub-layer 26a through the nonmagnetic intermediate sub-layer 26b in each of the pinned magnetic layers 26.

Each of the nonmagnetic material layers 25 comprises the interstitial portion 25a disposed between each of the end surfaces 23d of the free magnetic layer 23 and the inner end surface 26d of each pinned magnetic layer 26, and an extending portion 25b disposed between the bottom 26e of each pinned magnetic layer 26 and the lower gap layer 21. Of the interstitial portions 25a and the extending portions 25b, only the interstitial portions 25a contribute to magnetoresistance. In order to decrease a shunt loss of a sense current, the thickness of each extending portion 25b is preferably smaller than that of each interstitial portion 25a. The extending portions 25b are more preferably removed.

In the magnetic detecting element shown in FIG. 15, hard bias layers 29 are formed on both outsides of the pinned magnetic layers 26 and the antiferromagnetic layers 27 through bias underlying layers 28 comprising Cr, for supplying a longitudinal bias magnetic field to the free magnetic layer 23. Each of the hard bias layers 29 comprises CoPt. Furthermore, an electrode layer 31 comprising Cr is deposited on each hard bias layer 29 through an electrode underlying layer 30 comprising Ta.

A protective layer 24 comprising Ta is deposited on the free magnetic layer 23. Also, an upper gap layer 32 comprising an insulating material such as alumina or the like, and an upper shield layer 33 comprising a magnetic material such as NiFe or the like are formed over the protective layer 24, the antiferromagnetic layers 27 and the electrode layers 31.

Each of the antiferromagnetic layers 27 comprises a PtMn alloy, an X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

In order to form the antiferromagnetic layers 27, the ratio of Pt or X of the PtMn alloy or an alloy represented by the formula X—Mn is preferably in the range of 37 atomic % to 63 atomic %, and more preferably in the range of 47 atomic % to 57 atomic %. The upper and lower limits of such a numerical range represent "not more than" and "not less than", respectively, unless otherwise specified.

In an alloy represented by the formula Pt—Mn—X', the total of X'+Pt is preferably in the range of 37 atomic % to 63 atomic %, and more preferably 47 atomic % to 57 atomic %. In an alloy represented by the formula Pt—Mn—X', the ratio of X' is preferably in the range of 0.2 atomic % to 10 atomic %. When X' is at least one element of Pd, Ir, Rh, Ru, Os, and Ni, the ratio of X' is preferably in the range of 0.2 atomic % to 40 atomic %.

A heat treatment of the antiferromagnetic layers 27 comprising such an alloy can produce an exchange coupling film comprising each antiferromagnetic layer 27, which produces a large exchange coupling magnetic field. Particularly, the use of the PtMn alloy can produce an excellent exchange coupling film comprising each antiferromagnetic layer 27 and the first pinned magnetic sub-layer 26a of each pinned magnetic layer 26 and having an exchange coupling magnetic field of 48 kA/m or more, e.g., over 64 kA/m, and a high blocking temperature of 380° C. at which the exchange coupling magnetic field is lost.

Although these alloys have a disordered face-centered cubic structure (fcc) immediately after film deposition, the structure is transformed to a CuAuI-type ordered face-centered tetragonal structure (fct) by a heat treatment. The thickness of each antiferromagnetic layer 27 is 80 Å to 300 Å.

The sense current supplied the each electrode layers 31 is caused to flow through the pinned magnetic layers 26, the interstitial portions 25a of the nonmagnetic material layers 25, and the free magnetic layer 23 in the X direction shown in the drawing. Namely, the sense current flows in a direction crossing the interfaces between the free magnetic layer 23 and the nonmagnetic material layers 25 and the interfaces between the pinned magnetic layers 26 and the nonmagnetic material layers 25.

In order to increase the resistance change ΔR of the magnetic detecting element, the width dimension of the each pinned magnetic layer in a direction parallel to the film plane is preferably larger than the spin diffusion length of electrons with spin contributing to a change in magnetoresistance (electrons having a longer mean free path in a low-resistance state among spin up electrons and spin down electrons). The "spin diffusion length" represents a distance electrons flowing through the pinned magnetic layers can move without a change in spin.

In order to increase the resistance change ΔR of the magnetic detecting element, the thickness of each pinned magnetic layer is preferably larger than the mean free path of electrons. The "mean free path" represents a distance electrons can move through the pinned magnetic layers without being scattered, and the spin diffusion length is generally larger than the mean free path. This is due to the fact that spin inversion does not occur in scattering of conduction electrons in some cases.

When the thickness of each pinned magnetic layer is larger than the mean free path of electrons, for example, the mean free path of spin up electrons in a low-resistance state is increased to increase a difference from the mean free path of spin down electrons. Namely, the resistance change ΔR of the magnetic detecting element is increased.

However, the magnetic thickness (magnetic moment per unit area Ms×t (the product of saturation magnetization Ms and the thickness t of each pinned magnetic layer)) of each pinned magnetic layer is increased by increasing the thickness of each pinned magnetic layer, and thus the exchange coupling magnetic field between the antiferromagnetic layer and the pinned magnetic layer is decreased. Namely, the magnetization direction of each pinned magnetic layer easily varies to cause the problem of side reading, deterioration in output symmetry and deterioration in magnetic detection output.

As in this embodiment, when each pinned magnetic layer 26 has the synthetic ferrimagnetic structure comprising the first pinned magnetic sub-layer 26a and the second pinned magnetic sub-layer 26c each comprising a soft magnetic material, the first and second pinned magnetic sub-layers 26a and 26c being laminated with the nonmagnetic intermediate sub-layer 26b provided therebetween, the magnetization directions of the first pinned magnetic sub-layer 26a and the second pinned magnetic sub-layer 26c are pinned by each other, and thus the magnetization direction of the whole pinned magnetic layer 26 can be strongly pinned in a certain direction. Therefore, even when the thicknesses of both the first and second pinned magnetic sub-layers 26a and 26c are larger than the mean free paths of the respective layers, the magnetization direction of the free magnetic layer 26 can be strongly pined in a certain direction, thereby suppressing side reading and improving output symmetry and magnetic detection output. The magnetic thickness (Ms×t) of the first pinned magnetic sub-layer 26a may be larger or smaller than that of the second pinned magnetic sub-layer 26c. The thickness of each of the first pinned magnetic sub-layer 26a and the second pinned magnetic sub-layer 26c is, for example, 30 Å to 100 Å.

When an external magnetic field is applied in the Y direction, magnetization of the free magnetic layer 23 rotates to the Y direction. In this case, the magnetization of the free magnetic layer 23 approaches the direction antiparallel to the magnetization direction of the first pinned magnetic sub-layers 26a of the pinned magnetic layer 26, while the magnetization of the free magnetic layer 23 approaches a direction parallel to the magnetization direction of the second pinned magnetic sub-layers 26c of the pinned magnetic layer 26. When the relative angle between the magnetization directions of the pinned magnetic layers 26 and the free magnetic layer 23 changes, the resistance of the magnetic detecting element changes. The change in the resistance of the magnetic detecting element is taken out as a current change or voltage change to detect the external magnetic field.

The magnetic detecting element of this embodiment is characterized by the materials of the first pinned magnetic sub-layers 26a, the second pinned magnetic sub-layers 26c and the nonmagnetic intermediate sub-layers 26b of the pinned magnetic layers 26.

It is assumed that a NiX alloy (wherein X is one element selected from Co, Fe, Mn, Zr, Hf, Cu, and Au), a CoT alloy (wherein T is one element selected from Fe, Zr, Ta, and Hf), a FeZ alloy (wherein Z is one element selected from Ni, Co, Rh, Pt, Ir, Be, Al, Si, Ga, and Ge), and a Co—Mn—D alloy (wherein D is one element selected from Al, Ga, Si, Ge, and Sn) belong to group A, and a NiM alloy (wherein M is one element selected from Cr, Rh, Ru, Mo, Nb, Pt, Ir, Os, Re, W, and Ta), a CoQ alloy (wherein Q is one element selected from Mn, Cr, Ru, Mo, Ir, Os, Re, and W), and an FeA alloy (wherein A is one element selected from Mn, Cr, V, Ti, Ru, Mo, Os, Re, and W) belong to group B.

In this case, the first pinned magnetic sub-layers 26a comprise an alloy belonging to group A, and the second pinned magnetic sub-layers 26c comprise an alloy belonging to group B.

An alloy belonging to group A is a magnetic material having a positive $\beta$ value, and an alloy belonging to group B is a magnetic material having a negative $\beta$ value. However, the $\beta$ value is characteristic of a magnetic material satisfying the relationship $\rho\downarrow/\rho\uparrow = (1+\beta)/(1-\beta)$ $(-1 \leq \beta \leq 1)$ (wherein $\rho\downarrow$ represents resistivity for minority conduction electrons, and $\rho\uparrow$ represents resistivity for majority conduction electrons).

In this embodiment, each of the pinned magnetic layers 26 has the synthetic ferrimagnetic structure including the first pinned magnetic sub-layer 26a comprising a magnetic material having a positive $\beta$ value and the second pinned magnetic sub-layer 26c comprising a magnetic material having a negative $\beta$ value. The first pinned magnetic sub-layer 26a and the second pinned magnetic sub-layer 26c are in a state in which the magnetizations thereof are aligned in antiparallel directions due to the RKKY interaction through the nonmagnetic intermediate sub-layers 26b.

When the thickness of each nonmagnetic intermediate sub-layer 26b is set to a predetermined value peculiar to its material, the magnetizations of the first pinned magnetic sub-layers 26a and the second pinned magnetic sub-layer 26c can be aligned in antiparallel directions. For example, when each of the nonmagnetic intermediate sub-layers 26b comprises Ru and has a thickness of 3 Å to 10 Å, the magnetizations of the first pinned magnetic sub-layers 26a and the second pinned magnetic sub-layers 26c are aligned in antiparallel directions.

The majority conduction electrons easily flow through the first pinned magnetic sub-layers 26a, and the minority conduction electrons easily flow through the second pinned magnetic sub-layers 26c. When the majority conduction electrons of the first pinned magnetic sub-layers 26a are spin up electrons, the minority conduction electrons of the second pinned magnetic sub-layers 26c having the magnetization direction opposite to that of the first pinned magnetic sub-layers 26a are also spin up electrons. Namely, with no external magnetic field applied, the spin up electrons easily flow through both the first pinned magnetic sub-layers 26a and the second pinned magnetic sub-layers 26c.

When an external magnetic field is applied, the magnetization direction of each first pinned magnetic sub-layer 26a relative to the free magnetic layer 23 becomes different from the magnetization direction of each second pinned magnetic sub-layer 23c relative to the free magnetic layer 23. However, the spin up electrons less flow through both the first pinned magnetic sub-layers 26a and the second pinned magnetic sub-layer 26c.

Namely, both the electric resistance for the current flowing from the first pinned magnetic sub-layers 26a to the free magnetic layer 23 through the nonmagnetic material layers 25 and the electric resistance for the current flowing from the second pinned magnetic sub-layers 26c to the free magnetic layer 23 through the nonmagnetic material layers 25 are increased.

Therefore, even when each of the pinned magnetic layers 26 has the synthetic ferrimagnetic structure, a difference between the ease of a conduction electron flow in a low-resistance state and the ease of a conduction electron flow in a high-resistance state can be increased to increase the resistance change $\Delta R$.

The free magnetic layer 23 may comprise either a magnetic material having a positive $\beta$ value or a magnetic material having a negative $\beta$ value.

However, the magnetic material used for forming the thickest magnetic sub-layer, i.e., the first pinned magnetic sub-layer 26a, among the magnetic sub-layers constituting each pinned magnetic layer 26 preferably has a $\beta$ value with the same positive or negative sign as that of the magnetic material used for forming the free magnetic layers 23 because a flow of conduction electrons in a low-resistance state can be facilitated to increase the resistance change ΔR.

Also, when a nonmagnetic layer comprising a nonmagnetic material is laminated on a magnetic layer comprising a magnetic material, an interfacial resistance occurs at the interface between the magnetic layer and the nonmagnetic layer.

The value of interfacial resistance for the majority conduction electrons is also different from that for the minority conduction electrons.

Assuming that r↓ represents an interfacial resistance for the minority conduction electrons, and r↑ represents an interfacial resistance for the majority conduction electrons, a value γ characteristic of a combination of a magnetic material l and a nonmagnetic material can be defined by the following relationship:

$$r\downarrow/r\uparrow = (1+\gamma)/(1-\gamma) \quad (-1 \leq \gamma \leq 1)$$

Namely, when the γ value is positive (γ>0), the relation r↓>r↑ is established, and the majority conduction electrons easily flow through the interface. On the other hand, when the γ value is negative (γ<0), the relation r↓<r↑ is established, and the minority conduction electrons easily flow through interface.

In this embodiment, at each of the interfaces between the second pinned magnetic sub-layers 26c and the nonmagnetic intermediate sub-layers 26b, the positive or negative sign of γ is preferably equal to that of β of the second pinned magnetic sub-layers 26c because a flow of conduction electrons in a low-resistance state can be facilitated to increase the resistance change ΔR.

In this embodiment, the magnetic material of the second pinned magnetic sub-layers 26c has a negative β value. The nonmagnetic intermediate sub-layers 26b comprise a nonmagnetic material composed of at least one element selected from Ru, Cr, Rh, Ir, and Os so that the γ value at each of the interfaces between the second pinned magnetic sub-layers 26c and the nonmagnetic intermediate sub-layers 26b is negative.

When each of the nonmagnetic intermediate sub-layers 26b has a laminated structure of a Cu upper layer and a lower nonmagnetic material layer composed of at least one element selected from Ru, Cr, Rh, Ir, and Os, the γ value at each of the interfaces between the first pinned magnetic sub-layers 26a and the nonmagnetic intermediate sub-layers 26b can be made positive, and the γ value at each of the interfaces between the second pinned magnetic sub-layers 26c and the nonmagnetic intermediate sub-layers 26b can be made negative.

Figure 21:
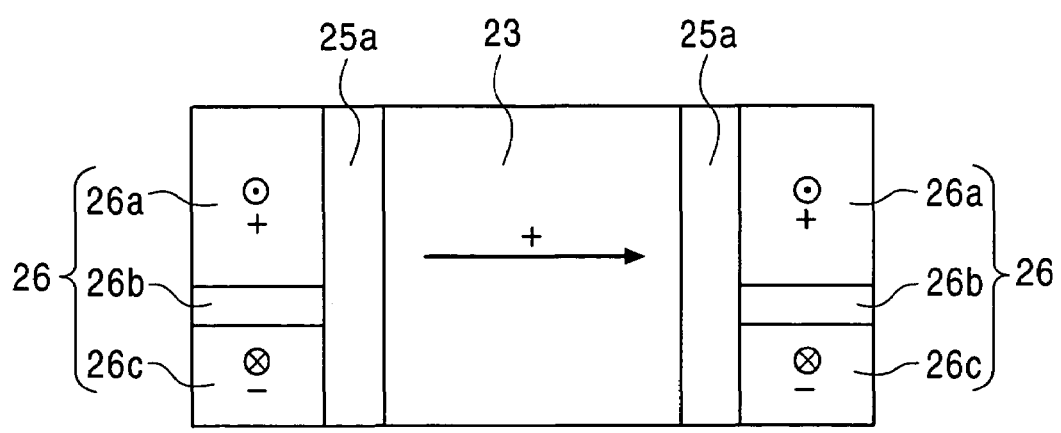
FIG. 21 is a schematic view showing an example of a combination of the magnetization directions and the signs of β of magnetic materials of a free magnetic layer and a pinned magnetic layer in a magnetic detecting element of the present invention.

FIG. 21 schematically shows a relation between the sign of β of the magnetic material and the magnetization direction of each of the first pinned magnetic sub-layers 26a and the second pinned magnetic sub-layer 26c of the pinned magnetic layer 26, and a relation between the sign of β of the magnetic material and the magnetization direction of the free magnetic layer 23.

Figure 22:
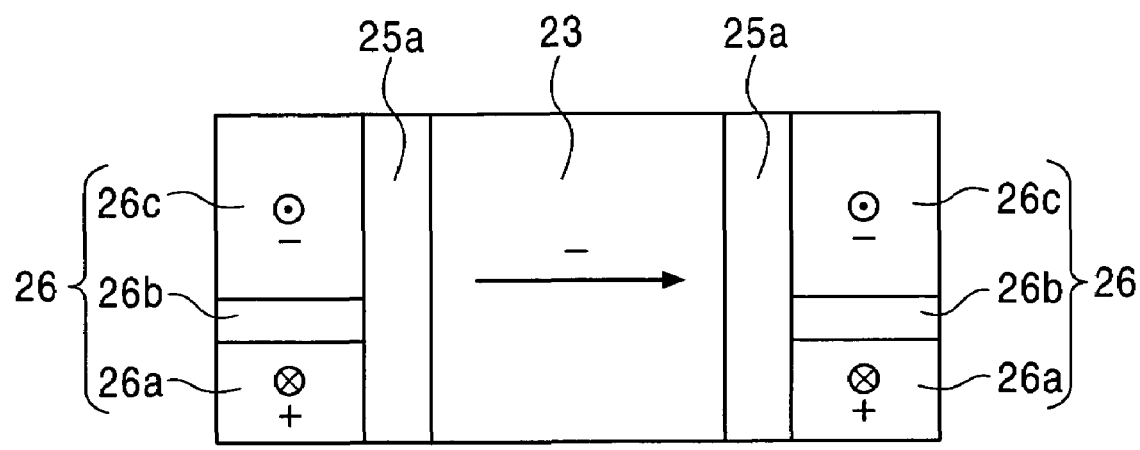
FIG. 22 is a schematic view showing an example of a combination of the magnetization directions and the signs of β of magnetic materials of a free magnetic layer and a pinned magnetic layer in a magnetic detecting element of the present invention.

As schematically shown in FIG. 22, in each of the pinned magnetic layers 26, the second pinned magnetic sub-layer 26c may be laminated on the first pinned magnetic sub-layer 26a. In this case, the second pinned magnetic sub-layers 26c are in contact with the respective antiferromagnetic layers. Also, the free magnetic layer 23 may comprise an alloy belonging to group B. In this case, the magnetic material used for forming each of the second pinned magnetic sub-layers 26c of the pinned magnetic layers 26 and the free magnetic layer 23 has a negative β value, and the material used for forming the first pinned magnetic sub-layers 26a of the pinned magnetic layers 26 has a positive β value. In FIG. 22, the magnetization direction of each of the magnetic layers is shown by an arrow.

Figure 23:
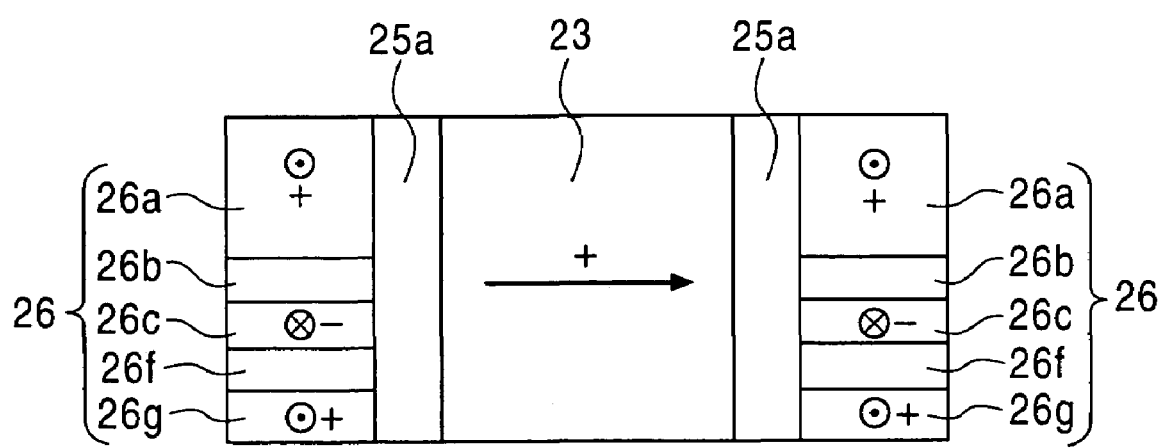
FIG. 23 is a schematic view showing an example of a combination of the magnetization directions and the signs of β of magnetic materials of a free magnetic layer and a pinned magnetic layer in a magnetic detecting element of the present invention.

As shown in FIG. 23, each of the pinned magnetic layers 26 may have a synthetic ferrimagnetic structure including a first pinned magnetic sub-layer 26a, a nonmagnetic intermediate sub-layer 26b, a second pinned magnetic sub-layer 26c, a nonmagnetic intermediate sub-layer 26f, and a third magnetic layer 23g, which are laminated in that order.

The magnetic thickness decreases in the order of the first pinned magnetic sub-layer 26a, the second pinned magnetic sub-layer 26c, and the third magnetic layer 23g. Also, the thickness decreases in the order of the first pinned magnetic sub-layer 26a, the second pinned magnetic sub-layer 26c, and the third magnetic layer 26g.

In FIG. 23, the free magnetic layer 23 comprises an alloy belonging to group A, i.e., a magnetic material having a positive β value. The first pinned magnetic sub-layer 26a which is thickest among the magnetic sub-layers constituting each pinned magnetic layer 26 comprises an alloy belonging to the same group A as that of the free magnetic layer 23, and the second pinned magnetic sub-layer 26c facing the first pinned magnetic sub-layer 26a through the nonmagnetic intermediate sub-layer 26b comprises an alloy (β<0) belonging to group B. Furthermore, the third pinned magnetic layer 26g facing the second pinned magnetic sub-layer 26b through the nonmagnetic intermediate sub-layer 26f comprises an alloy (β>0) belonging to group A. In FIG. 23, the magnetization direction of each magnetic layer is shown by an arrow.

In the combination of the magnetic materials and the magnetization directions shown in FIG. 22 or 23, a difference between the ease of a conduction electron flow in a low-resistance state and the ease of a conduction electron flow in a high-resistance state can be increased to increase the resistance change ΔR.

Alternatively, the resistivity of the magnetic material for forming the second pinned magnetic sub-layers 26c of the pinned magnetic layers 26 may be higher than that of the magnetic material for forming the first pinned magnetic sub-layers 26a.

Specifically, the first pinned magnetic sub-layers 26a comprise a NiFe alloy or a CoFe alloy, and the second pinned magnetic sub-layers 26c comprise a NiFeX alloy (wherein X is one element selected from Nb, Zr, Ti, Hf, Ta, Mo, W, Rh, Cr, Ru, Pt, Ir, and Sb), a CoT alloy (wherein T is one element selected from Al, Si, Ti, V, Cr, Mn, Zr, Nb, Mo, Ru, Rh, Hf, Ta, W, Re, and Ir), or a CoFeT alloy (wherein T is one element selected from Al, Si, Ti, V, Cr, Mn, Zr, Nb, Mo, Ru, Rh, Hf, Ta, W, Re, and Ir).

When the resistivity of the second pinned magnetic sub-layers 26c magnetized in the direction antiparallel to the magnetization direction of the first pinned magnetic sub-layers 26a is increased to inhibit a conductive electron flow of the sense current, a change in the electric resistance for the current flowing from the first pinned magnetic sub-layers 26a to the free magnetic layer 23 through the nonmagnetic material layers 25 can be prevented from being canceled by a change in the electric resistance for the current flowing from the second pinned magnetic sub-layers 26c to the free magnetic layer 23 through the nonmagnetic material layers 25. Therefore, the resistance change ΔR of the magnetic detecting element can be increased.

Even when the resistivity of the magnetic material for forming the first pinned magnetic sub-layers 26a of the pinned magnetic layers 26 is higher than that of the magnetic material for forming the second pinned magnetic sub-layers 26c, the same effect as described above can be obtained.

When the absolute value of β of the magnetic material for forming the second pinned magnetic sub-layers 26c is smaller than that of the magnetic material for forming the first pinned magnetic sub-layers 26a, the resistivity for the minority or majority conduction electrons of the second pinned magnetic sub-layers 26c magnetized in the direction antiparallel to the magnetization direction of the first pinned magnetic sub-layers 26a can be increased to inhibit the conduction electron flow of the sense current.

In this case, the β value is characteristic of a magnetic material satisfying the relationship $\rho\downarrow/\rho\uparrow=(1+\beta)/(1-\beta)$ ($-1\leq\beta\leq1$) (wherein $\rho\downarrow$ represents resistivity for minority conduction electrons, and $\rho\uparrow$ represents resistivity for majority conduction electrons).

When the absolute value of β of the magnetic material for forming the second pinned magnetic sub-layers 26c is smaller than that of the magnetic material for forming the first pinned magnetic sub-layers 26a, a change in electric resistance for the current flowing from the first pinned magnetic sub-layers 26a to the free magnetic layer 23 through the nonmagnetic material layers 25 can be prevented from being canceled by a change in electric resistance for the current flowing from the second pinned magnetic sub-layers 26c to the free magnetic layer 23 through the nonmagnetic material layers 25. Therefore, the resistance change ΔR of the magnetic detecting element can be increased.

Specifically, each of the first pinned magnetic sub-layers 26a comprises a NiFe alloy or a CoFe alloy, and each of the second pinned magnetic sub-layers 26c comprises a NiFeX alloy (wherein X is one element selected from Nb, Zr, Ti, Hf, Ta, Mo, W, Rh, Cr, Ru, Pt, Ir, and Sb), a CoT alloy (wherein T is one element selected from Al, Si, Ti, V, Cr, Mn, Zr, Nb, Mo, Ru, Rh, Hf, Ta, W, Re, and Ir), or a CoFeT alloy (wherein T is one element selected from Al, Si, Ti, V, Cr, Mn, Zr, Nb, Mo, Ru, Rh, Hf, Ta, W, Re, and Ir). In this case, the absolute value of β of the magnetic material for forming the second pinned magnetic sub-layers 26c can be made smaller than that of the magnetic material for forming the first pinned magnetic sub-layers 26a.

Even when the absolute value of β of the magnetic material for forming the first pinned magnetic sub-layers 26a is smaller than that of the magnetic material for forming the second pinned magnetic sub-layers 26c, the same effect as described above can be obtained.

Although, in this embodiment, each of the first pinned magnetic sub-layers 26a and the second pinned magnetic sub-layers 26c of the pinned magnetic layers 26, and the free magnetic layer 23 is a single magnetic layer, another magnetic layer comprising a magnetic material having the same positive or negative sign of β may be laminated on each of these magnetic layers.

In each of the pinned magnetic layers 26, the first pinned magnetic sub-layer 26a and the second pinned magnetic sub-layer 26c comprising the above-described magnetic materials may be formed in any synthetic ferrimagnetic structure. For example, a CoFe layer may be provided between the first pinned magnetic sub-layer 26a and the nonmagnetic intermediate sub-layer 26b and between the second pinned magnetic sub-layer 26c and the nonmagnetic intermediate sub-layer 26b to strengthen the RKKY interaction between the first pinned magnetic sub-layer 26a and the second pinned magnetic sub-layer 26c.

A method for supplying a longitudinal bias magnetic field to the free magnetic layer 23 will be described.

In the magnetic detecting element shown in FIG. 15, the hard bias layers 29 comprising Co—Pt are disposed on both outsides of the pinned magnetic layers 26 so that a longitudinal bias magnetic field is applied to the free magnetic layer 23 from the hard bias layers 29 in the X direction.

The hard bias layers 29 are formed on the respective bias underlying layers 28. Each of the bias underlying layers 28 preferably comprises a metal film having a body-centered cubic structure (bcc) with (100) orientation.

Examples of metal films having a body-centered cubic crystal structure with (100) orientation includes films of Cr (chromium), Ti (titanium), Mo (molybdenum), W (tungsten), and $W_{50}Mo_{50}$ (atomic %). Each of the bias underlying layers 28 may comprise one of these materials or a mixture of at least two materials.

When the hard bias layers 29 comprising a CoPt alloy are formed on the respective bias underlying layers 28 comprising Cr having a body-centered cubic structure with (100) orientation, the coercive force Hc and the remanence ratio S of residual magnetization (Br)/saturation magnetic flux density (Bs) of the hard bias layers 29 are increased. As a result, a bias magnetic field produced from the hard bias layers 29 is increased.

In the magnetic detecting element shown in FIG. 15, a static magnetic field produced from the hard bias layers 29 exerts on the free magnetic layer 23 beyond the pinned magnetic layers 26. Therefore, when the width dimension L1 of each pinned magnetic layer 26 in the X direction (track width direction) is excessively large, a longitudinal bias magnetic field of proper magnitude cannot be applied to the free magnetic layer 23. Specifically, the width dimension L1 of each pinned magnetic layer 26 in the X direction (track width direction) is set to about 50 angstroms so that a longitudinal bias magnetic field of proper magnitude can be applied to the free magnetic layer 23. Even when the width dimension L1 of each pinned magnetic layer 26 in the X direction (track width direction) is about 50 angstroms, the exchange anisotropic magnetic field produced between each pinned magnetic layer 26 and the antiferromagnetic layer 27 can be increased by using the above-described antiferromagnetic material for the antiferromagnetic layers 27. Therefore, magnetization of each pinned magnetic layer 26 can be strongly pinned to prevent the magnetization direction of each pinned magnetic layer 26 from fluctuating due to the static magnetic field produced from each hard bias layer 29.

Figure 16:
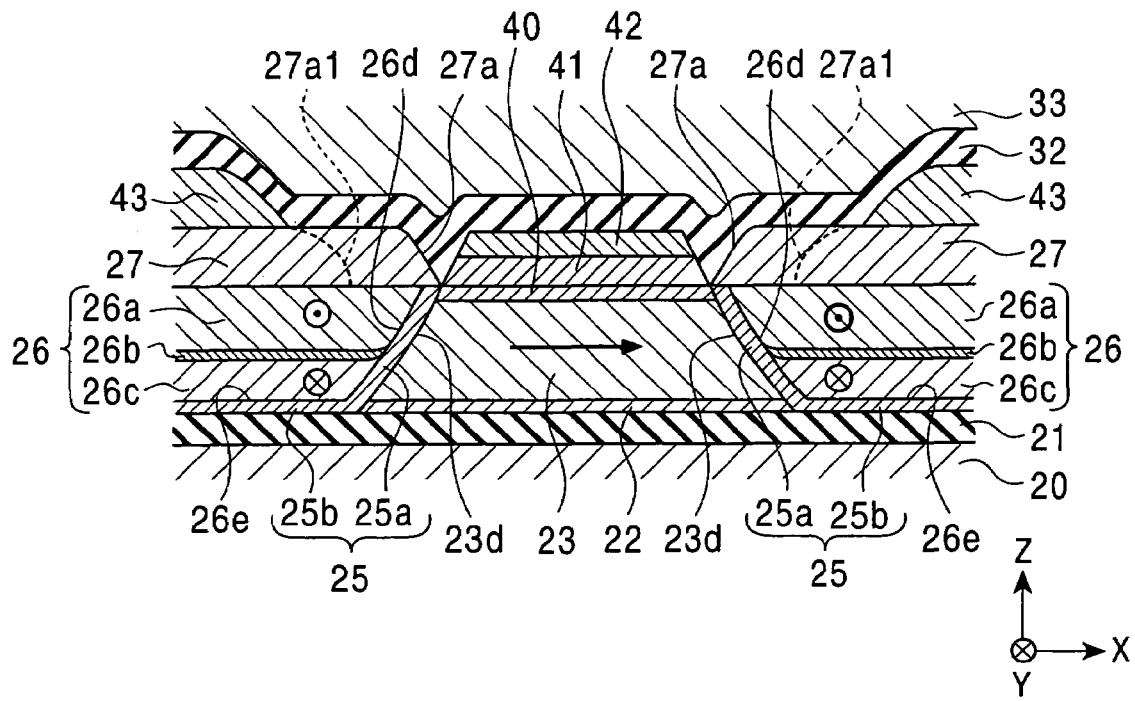
FIG. 16 is a sectional view showing a magnetic detecting element according to a ninth embodiment of the present invention.

FIG. 16 is a partial sectional view showing the structure of a magnetic detecting element according to a ninth embodiment of the present invention, as viewed from a surface facing a recording medium. In FIG. 16, a layer denoted by the same reference numeral as in FIG. 15 comprises the same material and has the same thickness and shape as those of the corresponding layer shown in FIG. 15 unless otherwise specified.

The magnetic detecting element shown in FIG. 16 is different from that shown in FIG. 15 in that hard bias layers are not formed on both outsides of the pinned magnetic layers 26, but a ferromagnetic layer 41 and an antiferromagnetic layer 42 are laminated on the free magnetic layer 23 through a separating layer 40 comprising alumina.

An exchange anisotropic magnetic field is produced at the interface between the ferromagnetic layer 41 and the antiferromagnetic layer 42 to pin magnetization of the ferromagnetic layer 41 in the direction antiparallel to the X direction shown in the drawing. Furthermore, magnetostatic coupling occurs between the free magnetic layer 23 and the ferromagnetic layer 41. As a result, magnetization of the free magnetic layer 23 is oriented in the X direction.

Figure 17:
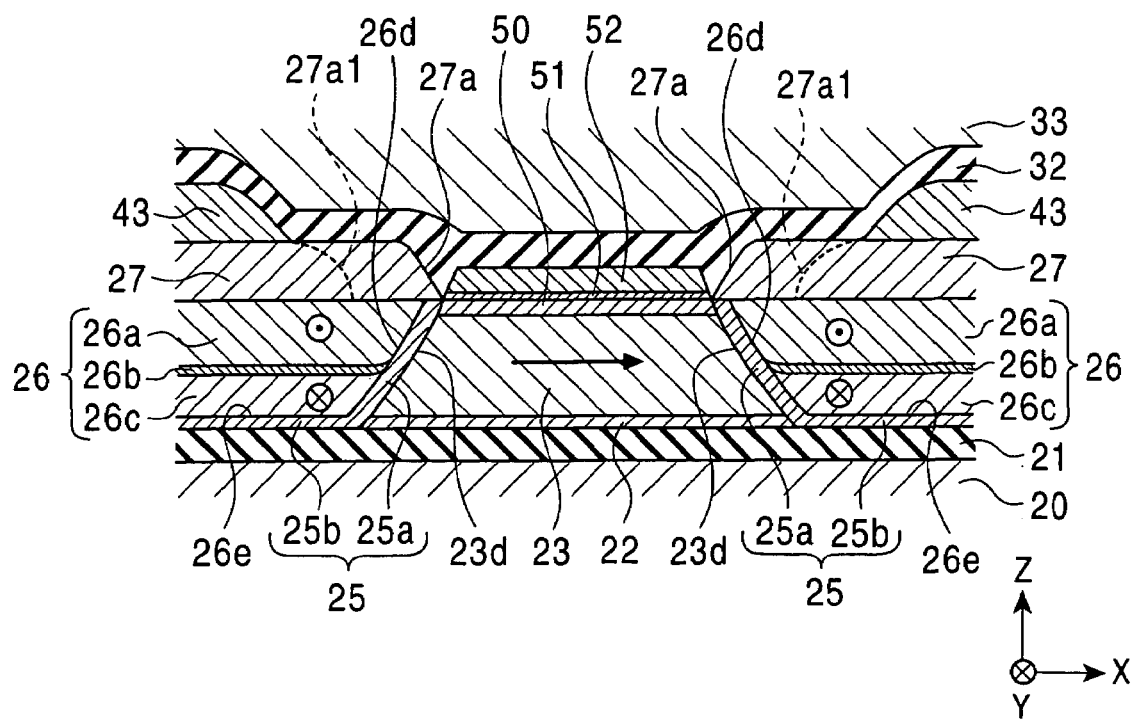
FIG. 17 is a sectional view showing a magnetic detecting element according to a tenth embodiment of the present invention.

FIG. 17 is a partial sectional view showing the structure of a magnetic detecting element according to a tenth embodiment of the present invention, as viewed from a surface facing a recording medium. In FIG. 17, a layer denoted by the same reference numeral as in FIG. 15 comprises the same material and has the same thickness and shape as those of the corresponding layer shown in FIG. 15 unless otherwise specified.

The magnetic detecting element shown in FIG. 17 is different from that shown in FIG. 15 in that hard bias layers are not formed on both outsides of the respective pinned magnetic layers 26, but an underlying layer 51 and a hard magnetic layer 52 are laminated on the free magnetic layer 23 through a separating layer 50 comprising alumina.

The underlying layer 51 comprises Cr, Ta or a Ta/Cr laminated film, and the hard magnetic layer 52 comprises Co—Pt. The hard magnetic layer 52 is magnetized in the direction antiparallel to the X direction. Furthermore, magnetostatic coupling occurs between the free magnetic layer 23 and the hard magnetic layer 52. As a result, magnetization of the free magnetic layer 23 is oriented in the X direction.

The longitudinal bias system of the magnetic detecting element shown in FIG. 16 or 17 is referred to as an "in-stack bias system". The in-stack bias system can suppress the occurrence of a dead zone in which magnetization of a free magnetic layer is strongly pinned near the end surfaces to deteriorate magnetic reversal. It is thus possible to appropriately promote single-magnetic-domain formation in the free magnetic layer, improve magnetic reversal of the free magnetic layer with an external magnetic field, and produce a magnetic detecting element having high reproduction sensitivity and excellent stability of a reproduction waveform.

In the magnetic detecting element shown in FIG. 16 or 17, both end surfaces of the free magnetic layer 23 and both end surfaces of separating layer 40 or 50 and the ferromagnetic layer 41 or the hard magnetic layer 52 in the track width direction are formed as a continuous surface. Thus, magnetostatic coupling between the free magnetic layer 23 and the ferromagnetic layer 41 or the hard magnetic layer 52 can be improved to promote single-magnetic-domain formation in the free magnetic layer 23. The thickness of the ferromagnetic layer 41 or the hard magnetic layer 52 is preferably 50 Å to 300 Å.

Figure 18:
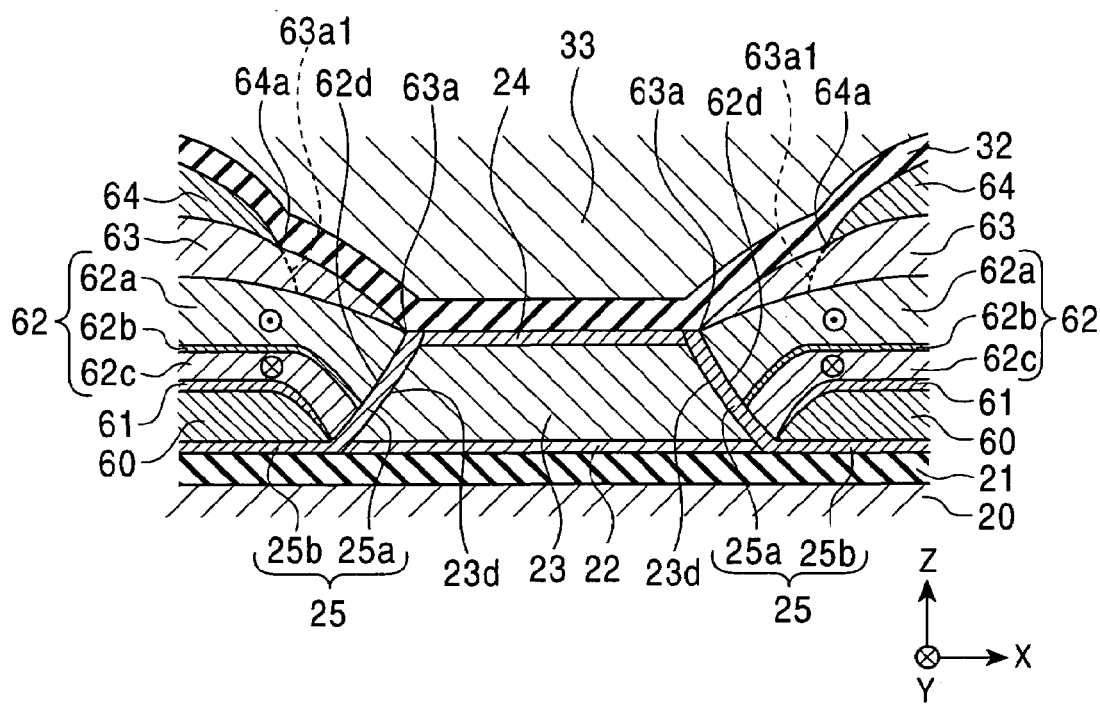
FIG. 18 is a sectional view showing a magnetic detecting element according to an eleventh embodiment of the present invention.

FIG. 18 is a partial sectional view showing the structure of a magnetic detecting element according to an eleventh embodiment of the present invention, as viewed from a surface facing a recording medium. In FIG. 18, a layer denoted by the same reference numeral as in FIG. 15 comprises the same material and has the same thickness and shape as those of the corresponding layer shown in FIG. 15 unless otherwise specified.

The magnetic detecting element shown in FIG. 18 is different from that shown in FIG. 15 in that separating layers 61 comprising a nonmagnetic material, pinned magnetic layers 62, antiferromagnetic layers 63 and electrode layers 64 are laminated in that order on respective hard bias layers 60 formed on both sides of the free magnetic layer 23. Each of the pinned magnetic layers 62 has a synthetic ferromagnetic structure including a first pinned magnetic sub-layer 62a, a nonmagnetic intermediate sub-layer 62b and a second pinned magnetic sub-layer 62c. The materials for the first pinned magnetic sub-layers 62a, the nonmagnetic intermediate sub-layers 62b and the second pinned magnetic sub-layers 62c are the same as those for the first pinned magnetic sub-layers 26a, the nonmagnetic intermediate sub-layers 25 and the second pinned magnetic sub-layers 26c of the magnetic detecting element shown in FIG. 15.

The inner side surface 60a of each of the hard bias layers 60 is inclined or curved. Therefore, the thickness of each hard bias layer 60 gradually decreases nearer to the free magnetic layer 23. With the hard bias layers 60 each having such a tapered shape, the junction area between the inner end surface 62a of each pinned magnetic layer 62 and the interstitial portion 25a of the corresponding nonmagnetic material layer 25 can be increased to increase a change in magnetoresistance.

In the magnetic detecting element shown in FIG. 18, the hard bias layers 60 can be provided near the free magnetic layer 23, and thus the free magnetic layer 23 can be easily appropriately put into a single magnetic domain state, as compared with the magnetic detecting element of the structure shown in FIG. 15.

Figure 19:
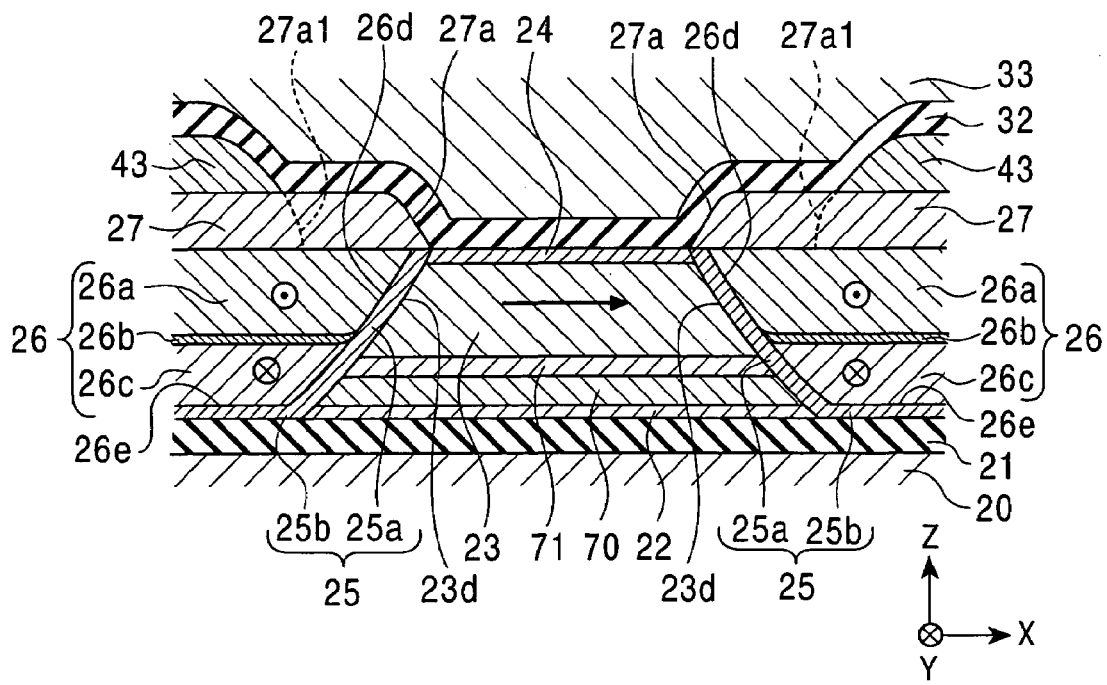
FIG. 19 is a sectional view showing a magnetic detecting element according to a twelfth embodiment of the present invention.

In the magnetic detecting element shown in FIG. 18, specular layers or insulating layers, which will be described below, are respectively provided between the hard bias layers 60 and the pinned magnetic layers 62. In this case, a shunt loss of the sense current to the hard bias layers 60 can be decreased, and a change in magnetoresistance can be increased. FIG. 19 is a partial sectional view showing the structure of a magnetic detecting element according to a twelfth embodiment of the present invention, as viewed from a surface facing a recording medium. In FIG. 19, a layer denoted by the same reference numeral as in FIG. 15 comprises the same material and has the same thickness and shape as those of the corresponding layer shown in FIG. 15 unless otherwise specified.

The magnetic detecting element shown in FIG. 19 is different from that shown in FIG. 15 in that hard bias layers are not formed on both outsides of the respective pinned magnetic layers 26, but an antiferromagnetic layer 70 is provided below the free magnetic layer 23 through a nonmagnetic layer 71.

The nonmagnetic layer 71 comprises Cu or Ru, and the antiferromagnetic layer 70 comprises the same material as the antiferromagnetic layers 27, for example, a PtMn alloy. Also, an indirect exchange coupling magnetic field (long range exchange coupling) occurs between the free magnetic layer 23 and the antiferromagnetic layer 70 through the nonmagnetic layer 71. As result, magnetization of the free magnetic layer 23 is put into a single magnetic domain state in the X direction. Since the nonmagnetic layer 71 is interposed between the free magnetic layer 23 and the antiferromagnetic layer 70, the exchange coupling magnetic field can be properly weakened. Therefore, the free magnetic layer 23 can be put into a single magnetic domain state, and magnetization rotation can be facilitated.

Although, in FIG. 19, the antiferromagnetic layer 70 is provided below the free magnetic layer 23 through the nonmagnetic layer 71, the antiferromagnetic layer may be provided above the free magnetic layer 23 through the nonmagnetic layer.

Figure 20:
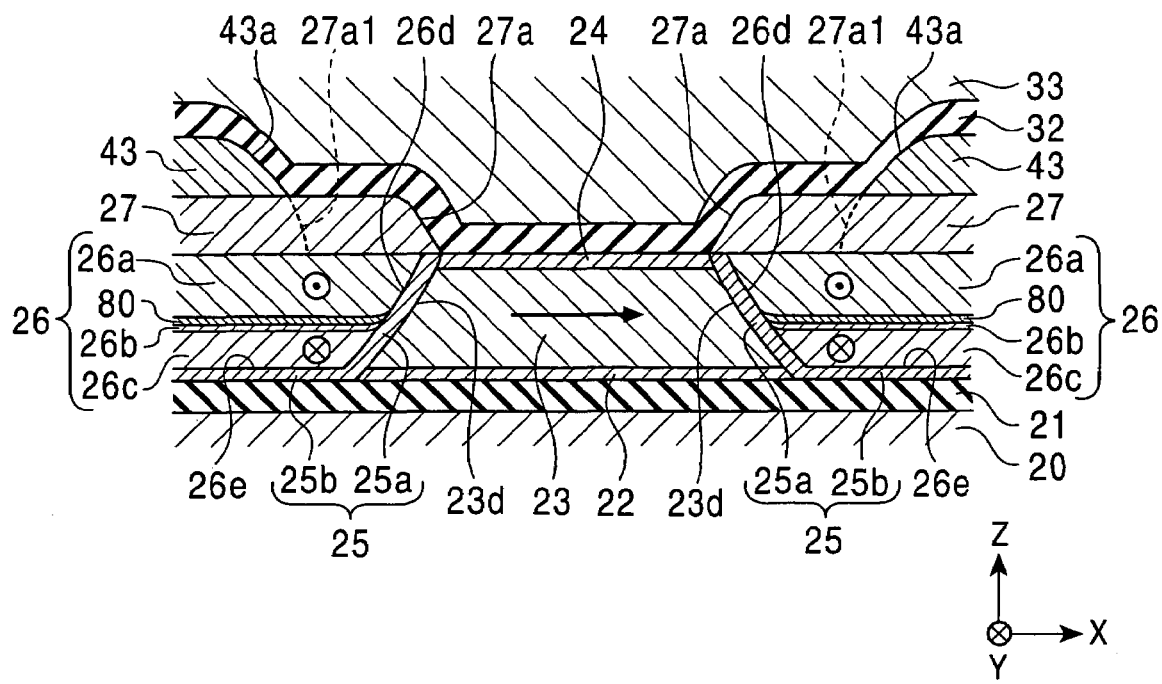
FIG. 20 is a sectional view showing a magnetic detecting element according to a thirteenth embodiment of the present invention.

FIG. 20 is a partial sectional view showing the structure of a magnetic detecting element according to a thirteenth embodiment of the present invention, as viewed from a surface facing a recording medium. In FIG. 20, a layer denoted by the same reference numeral as in FIG. 15 comprises the same material and has the same thickness and shape as those of the corresponding layer shown in FIG. 15 unless otherwise specified.

The magnetic detecting element shown in FIG. 20 is different from that shown in FIG. 15 in that a specular layer 80 is provided between the first pinned magnetic sub-layer 26a and the nonmagnetic intermediate sub-layer 26b of each pinned magnetic layer 26, for reflecting (specular reflection) the conduction electrons of the sense current while maintaining the spin direction thereof. The specular layer 80 may have defects (pin holes).

As shown in FIG. 20, when the specular layer 80 is formed in each pined magnetic layer 26, the conduction electrons reaching the specular layers 80 are specularly reflected by the specular layers 80 while maintaining the spin state (energy, quantum state, etc.). The moving direction of the conduction electrons specularly reflected by the specular layers 80 is changed so that the conduction electrons can pass through the pinned magnetic layers 26.

Therefore, the mean free path λ of the conduction electrons having spin (for example, spin up) contributing to magnetoresistance can be lengthened by providing the specular layers 80 to increase a difference between the mean free path of spin-up conduction electrons and that of spin-down conduction electrons, as compared with a conventional magnetic detecting element. Therefore, the rate (ΔR/R) of resistance change can be increased, and reproduction output can also be improved.

For example, the nonmagnetic intermediate sub-layer 26b of each pinned magnetic layer 26 is deposited, and then the nonmagnetic intermediate sub-layers 26b are oxidized so that the oxidized layers can function as the specular layers 80. Then, the first pinned layers 26a are deposited on the respective specular layers 80.

The specular layers 80 may be respectively provided in the first pinned magnetic sub-layers 26a or the second pinned magnetic sub-layers 26c, between the second pinned magnetic sub-layers 26b and the nonmagnetic intermediate sub-layers 26b or below the second pinned magnetic sub-layers 26c. In this case, the first pinned magnetic sub-layer 26a or the second pinned magnetic sub-layer 26c may be oxidized so that the oxidized layers can function as the specular layers 80.

Examples of a material for the specular layers 80 include oxides such as Fe—O, Ni—O, Co—O, Co—Fe—O, Co—Fe—Ni—O, Al—O, Al—Q—O (wherein Q is at least one element selected from B, Si, N, Ti, V, Cr, Mn, Fe, Co, and Ni), and R—O (wherein R is at least one selected from Cu, Ti, V, Cr, Zr, Nb, Mo, Hf, Ta, and W); nitrides such as Al—N, Al—Q—N (wherein Q is at least one element selected from B, Si, O, Ti, V, Cr, Mn, Fe, Co, and Ni), and R—N (wherein R is at least one selected from Ti, V, Cr, Zr, Nb, Mo, Hf, Ta, and W); semimetal whistler alloys; and the like.

In depositing the specular layers 80 by sputtering, for example, the temperature of a substrate on which the magnetic detecting element is formed is 0 to 100° C., the distance between the substrate and a material target for the specular layers 80 is 100 mm to 300 mm, and the Ar gas pressure is $10^{-5}$ to $10^{-3}$ Torr ($1.3 \times 10^{-3}$ to 0.13 Pa).

Although a bias structure for applying a longitudinal bias magnetic field to the free magnetic layer 23 is not shown in FIG. 20, any one of the bias systems shown in FIGS. 15 to 19 may be used.

When each of the pinned magnetic layers 26 has the synthetic ferrimagnetic structure, as in the present invention, magnetization of each pinned magnetic layer 26 can be strongly pinned in one direction. Therefore, even if the first pinned magnetic sub-layers 26a of the pinned magnetic layers 26 are not completely covered with the antiferromagnetic layers 27, magnetization of each pinned magnetic layer 26 can be sufficiently strongly pinned. Thus, the inner side surfaces 27a of the antiferromagnetic layers 27 can be disposed apart from the free magnetic layer 23, as shown by dotted lines 27a1 in FIGS. 15, 16, 17, 18, 19 and 20. When the inner end surfaces 27a of the antiferromagnetic layers 27a are separated from the free magnetic layer 23, a sense current shunt loss can be decreased. Alternatively, the inner edges 63a of the antiferromagnetic layers 63 shown in FIG. 18 can be disposed at positions shown by dotted lines 63a1 apart from the free magnetic layer 23.

In each of the magnetic detecting elements shown in FIGS. 16, 17, 19, and 20, the inner end surfaces 43a of the electrode layers 43 are disposed more apart from the free magnetic layer 23 than the inner end surfaces 27a of the antiferromagnetic layers 27. In the magnetic detecting element shown in FIG. 18, the inner edges 64a of the electrode layers 64 are provided more apart from the free magnetic layer 23 than the inner edges 63a of the antiferromagnetic layer 63. In this way, the electrode layers are provided apart from the free magnetic layer to decrease a shunt loss of the sense current.

A method for manufacturing the magnetic detecting element shown in FIG. 15 will be described.

First, the lower shield layer 20, the lower gap layer 21, the underlying layer 22, the free magnetic layer 23, and the protective layer 24 are deposited in the form of a solid film on the substrate to form a multilayer film, and then a central portion of the multilayer film is masked with a lift-off resist, for removing both side portions of the multilayer film by ion milling. The incidence angle of ion milling is, for example 70° to 90° with respect to the surface of the protective layer.

The materials for the lower shield layer 20, the lower gap layer 21, the underlying layer 22, the free magnetic layer 23, and the protective layer 24 are the same as those described above for the structure of the magnetic detecting element shown in FIG. 15.

Figure 24:
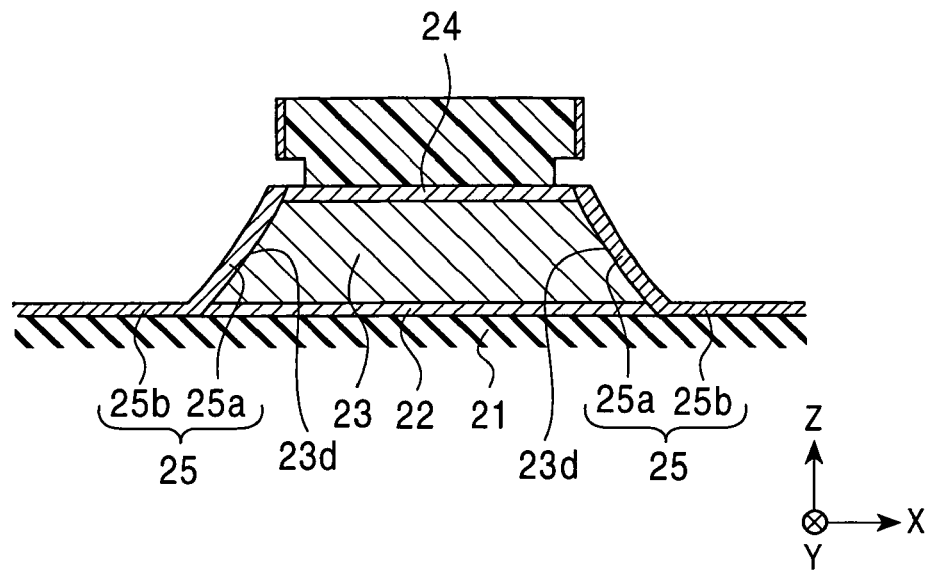
FIG. 24 is a drawing showing a step of a method for manufacturing a magnetic detecting element of the present invention.

Next, as shown in FIG. 24, the nonmagnetic material layers 25 are deposited on the underlying layer 22 and the end surfaces 23d of the free magnetic layer 23 by sputtering Cu with the resist layer R1 remaining on the protective layer 24. As the sputtering method, any one or more of an ion beam sputtering method, a long slow sputtering method, and a collimation sputtering method may be used.

The incidence angle of sputtering for depositing the nonmagnetic material layers 25 is, for example, 30° to 70° with respect to the surface of the lower gap layer 21 (or the surface of the substrate). The incidence angle of sputtering for depositing the nonmagnetic material layers 25 is set to a small value so as to deposit the nonmagnetic material layers 25 mainly on the end surfaces 23d of the free magnetic layer 23 and make it difficult to deposit the nonmagnetic material layers 25 on the portions of the lower gap layer 21 exposed on both sides of the free magnetic layer 23. Therefore, the thickness of the interstitial portion 25a of the nonmagnetic material layer 25 deposited on each of the end surfaces 23d of the free magnetic layer 23 is larger than that of each of the extending portions 25b formed on the lower gap layer 21. The thickness of each interstitial portion 25a in the X direction is 20 Å to 50 Å. Since the extending portions 25b cause a shunt loss of the sense current without contributing to magnetoresistance, the thickness of each extending portion 25b is preferably as small as possible. After the nonmagnetic material layers 25 are formed, the extending portions 25b of the nonmagnetic material layers 25 may be removed by ion milling perpendicularly to the surface of the lower gap layer 21.

Figure 25:
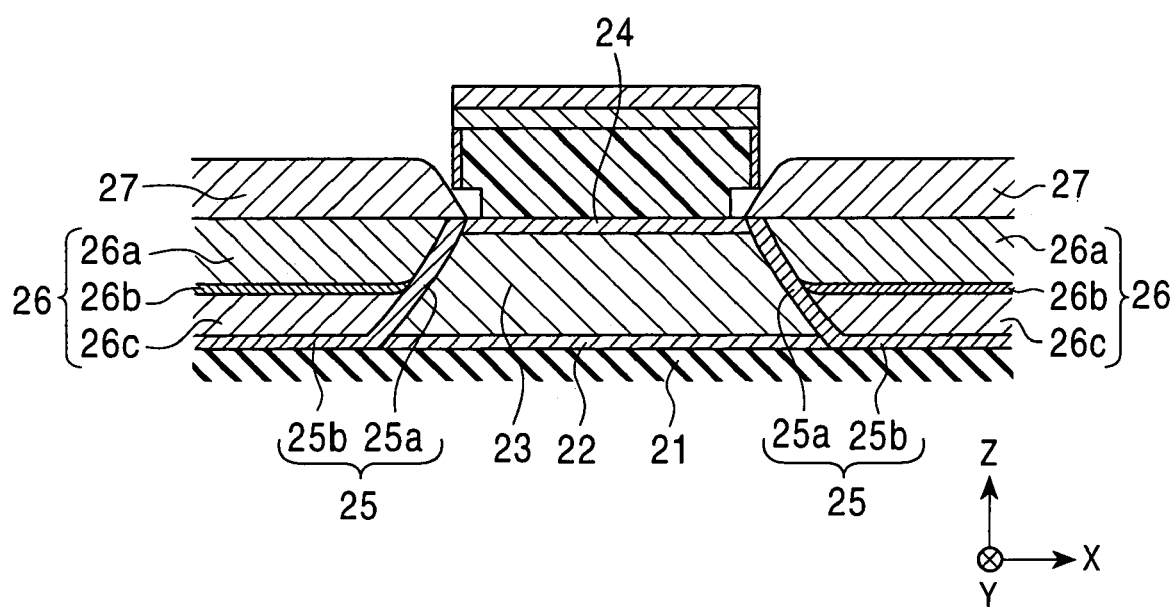
FIG. 25 is a drawing showing a step of a method for manufacturing a magnetic detecting element of the present invention.
Figure 26:
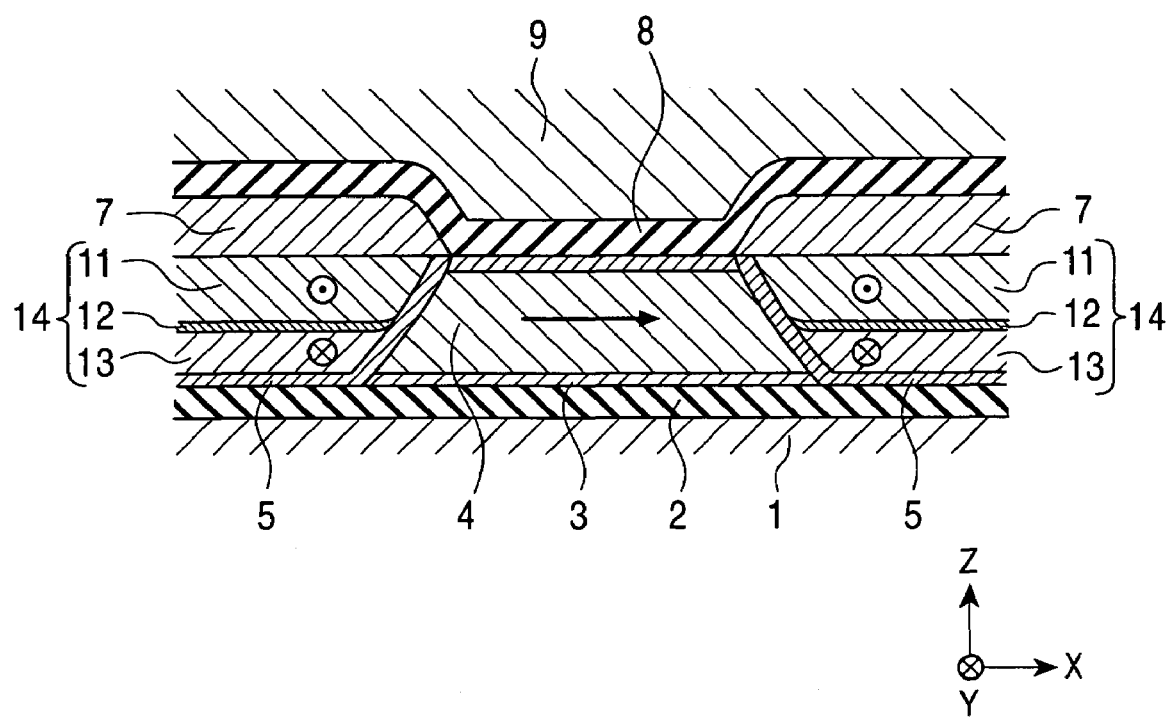
FIG. 26 is a sectional view showing a conventional magnetic detecting element.

Next, as shown in FIG. 25, the second pinned magnetic sub-layers 26c, the nonmagnetic intermediate sub-layers 26b and the first pinned magnetic sub-layers 26a of the pinned magnetic layers 26 and the antiferromagnetic layers 27 are continuously deposited by sputtering with the resist layer R1 remaining on the protective layer 24. As the sputtering method, any one or more of an ion beam sputtering method, a long slow sputtering method, and a collimation sputtering method may be used. The incidence angle of sputtering for depositing the pinned magnetic layers 26 and the antiferromagnetic layers 27 is, for example, 50° to 90° with respect to the surface of the lower gap layer 21 (or the surface of the substrate).

In forming the magnetic detecting element shown in FIG. 15, the resist layer R1 is removed after the step shown in FIG. 25. Then, the dimension (element height) of the magnetic detecting element in the depth direction of the element (height direction; the Y direction shown in the drawing) is defined by patterning, and then a resist layer having a larger width dimension (the width dimension in the X direction) than that of the resist layer R1 is deposited to mask the entire surface of the free magnetic layer 23 and portions of the pinned magnetic layers 26 and the antiferromagnetic layers 27. Then, both side portions of the pinned magnetic layers 26 and the antiferromagnetic layers 27, which are not masked with the resist layer, are removed, the bias underlying layers 28, the hard bias layers 29, the underlying layers 30 and the electrode layers 31 are deposited on both sides of the remaining pinned magnetic layers 26 and antiferromagnetic layers 27. After the resist layer is removed, the upper gap layer 32 and the upper shield layer 33 are laminated.

A heat treatment is performed in a magnetic field in the direction antiparallel to the Y direction to produce an exchange anisotropic magnetic field at the interface between each pinned magnetic layer 26 and antiferromagnetic layer 27, and the hard bias layers 29 are magnetized in the X direction at room temperature to obtain the magnetic detecting element shown in FIG. 15.

In forming the magnetic detecting element shown in FIG. 16, the lower shield layer 20, the lower gap layer 21, the underlying layer 22, the free magnetic layer 23, the separating layer 40, the ferromagnetic layer 41, and the antiferromagnetic layer 42 are deposited in the form of a solid film to form a multilayer film. Then, first magnetic field annealing is performed to produce an exchange anisotropic magnetic field in the direction antiparallel to the X direction at the interface between the ferromagnetic layer 41 and the antiferromagnetic layer 42. Then, the same steps as those shown in FIGS. 24 and 25 are performed. Next, second magnetic field annealing is performed in a magnetic field in the direction antiparallel to the Y direction to produce an exchange anisotropic magnetic field at each of the interfaces between the pinned magnetic layers 26 and the antiferromagnetic layers 27.

In forming the magnetic detecting element shown in FIG. 17, the lower shield layer 20, the lower gap layer 21, the underlying layer 22, the free magnetic layer 23, the separating layer 50, the underlying layer 51, and the hard magnetic layer 52 are deposited in the form of a solid film to form a multilayer film. Then, the same steps as those shown in FIGS. 24 and 25 are performed.

In forming the magnetic detecting element shown in FIG. 18, the same step as that shown in FIG. 24 is performed, and then the hard bias layers 60, the separating layers 61, the pinned magnetic layers 62, the antiferromagnetic layers 63 and the electrode layers 64 are deposited.

In forming the magnetic detecting element shown in FIG. 19, the lower shield layer 20, the lower gap layer 21, the underlying layer 22, the antiferromagnetic layer 70, and nonmagnetic layer 71, the free magnetic layer 23, and the protective layer 24 are deposited in the form of a solid film to form a multilayer film. Then, the same steps as those shown in FIGS. 24 and 25 are performed.

In the present invention described in detail above, the free magnetic layer has a synthetic ferromagnetic structure including a first free magnetic sub-layer comprising a magnetic material having a positive $\beta$ value and a second free magnetic sub-layer comprising a magnetic material having a negative $\beta$ value. The first free magnetic sub-layer and the second free magnetic sub-layer assume a state in which the magnetizations thereof are oriented in antiparallel directions due to a RKKY interaction through a nonmagnetic intermediate sub-layer.

When an external magnetic field is applied to a magnetic detecting element, both an electric resistance for a current flowing from the pinned magnetic layers to the first free magnetic sub-layer through nonmagnetic material layers and an electric resistance for a current flowing from the pinned magnetic layers to the second free magnetic sub-layer through the nonmagnetic material layers change with a same phase with the angle of magnetization rotation of the free magnetic layer.

Therefore, in the magnetic detecting element of the present invention, a difference between the ease of a conduction electron flow in a low-resistance state and the ease of a conduction electron flow in a high-resistance state can be increased to increase a resistance change $\Delta R$.

Also, in the present invention, the magnetic material for each of the magnetic layers of the free magnetic layer can be defined so that the first free magnetic sub-layer of the free magnetic layer comprises a magnetic material having a positive $\beta$ value, and the second free magnetic sub-layer comprises a magnetic material having a negative $\beta$ value.

Furthermore, in the present invention, the resistivity of the second free magnetic sub-layer which is magnetized in the direction antiparallel to the magnetization direction of the first free magnetic sub-layer is set to a high value, for suppressing an offset of a change in the electric resistance for a current flowing from the pinned magnetic layers to the first free magnetic sub-layer through the nonmagnetic material layers and a change in the electric resistance for a current flowing from the pinned magnetic layers to the second free magnetic sub-layer through the nonmagnetic material layers. Therefore, a resistance change $\Delta R$ of the magnetic detecting element can be increased.

In the present invention, the magnetic layers include the first free magnetic sub-layer and the second free magnetic sub-layer comprising a magnetic material having a smaller absolute value of $\beta$ than that of a magnetic material for the first free magnetic sub-layer, so that resistivity for the majority conduction electrons of the second free magnetic sub-layer, which is magnetized in the direction antiparallel to the magnetization direction of the first free magnetic sub-layer, can be increased to increase the resistance change $\Delta R$ of the magnetic detecting element.

In the present invention described in detail above, each of pinned magnetic layers has a synthetic ferromagnetic structure including a first pinned magnetic sub-layer comprising a magnetic material having a positive $\beta$ value and a second pinned magnetic sub-layer comprising a magnetic material having a negative $\beta$ value. Each pinned magnetic layer and second magnetic layer are in a state in which the magnetizations thereof are oriented in antiparallel directions due to a RKKY interaction through a nonmagnetic intermediate sub-layer.

When an external magnetic field is applied to the magnetic detecting element, an electric resistance for a current flowing from the first pinned magnetic sub-layers to the free magnetic layer through nonmagnetic material layers and an electric resistance for a current flowing from the second pinned magnetic sub-layers to the free magnetic layer through the nonmagnetic material layers are increased with a same phase with the angle of magnetization rotation of the free magnetic layer.

Therefore, in the magnetic detecting element of the present invention, a difference between the ease of a conduction electron flow in a low-resistance state and the ease of a conduction electron flow in a high-resistance state can be increased to increase the resistance change $\Delta R$.

Also, in the present invention, the magnetic material for each of the magnetic layers of each pinned magnetic layer can be defined so that the first pinned magnetic sub-layer of each pinned magnetic layer comprises a magnetic material having a positive $\beta$ value, and the second pinned magnetic sub-layer comprises a magnetic material having a negative $\beta$ value.

Furthermore, in the present invention, the resistivity of the second pinned magnetic sub-layers which are magnetized in the direction antiparallel to the magnetization direction of the first pinned magnetic sub-layers is set to a high value, for suppressing an offset of a change in the electric resistance for a current flowing from the first pinned magnetic sub-layers to the free magnetic layer through the nonmagnetic material layers and a change in the electric resistance for a current flowing from the second pinned magnetic sub-layers to the free magnetic layer through the nonmagnetic material layers. Therefore, a resistance change $\Delta R$ of the magnetic detecting element can be increased.

In the present invention, each of the pinned magnetic layers includes the first pinned magnetic sub-layer and the second pinned magnetic sub-layer comprising a magnetic material having a smaller absolute value of $\beta$ than that of a magnetic material for forming the first pinned magnetic sub-layer, so that the resistivity for the majority conduction electrons of the second pinned magnetic sub-layer, which is magnetized in the direction antiparallel to the magnetization direction of the first pinned magnetic sub-layer, can be increased to increase the resistance change $\Delta R$ of the magnetic detecting element.

What is claimed is:

1. A magnetic detecting element comprising:
    a free magnetic layer disposed on a lower gap layer comprising an insulating material; and
    pinned magnetic layers opposing both end surfaces of the free magnetic layer through nonmagnetic material layers so that a sense current flows in a direction crossing interfaces between the free magnetic layer and the nonmagnetic material layers and interfaces between the pinned magnetic layers and the non magnetic material layers;
    wherein assuming that a NiX alloy (wherein X is one element selected from Co, Fe, Mn, Zr, Hf, Cu, and Au), a CoT alloy (wherein T is one element selected from Fe, Zr, Ta, and Hf), a FeZ alloy (wherein Z is one element selected from Rh, Pt, Ir, Be, Al, Si, Ga, and Ge), and a Co—Mn—D alloy (wherein D is one element selected from Al, Ga, Si, Ge, and Sn) belong to group A, and a NiM alloy (wherein M is one element selected from Cr, Rh, Ru, Mo, Nb, Pt, Ir, Os, Re, W, and Ta), a CoQ alloy (wherein Q is one element selected from Mn, Cr, Ru, Mo, Ir, Os, Re, and W), and an FeA alloy (wherein A is one element selected from Mn, Cr, V, Ti, Ru, Mo, Os, Re, and W) belong to group B, the free magnetic layer has a synthetic ferrimagnetic structure comprising a upper free magnetic sub-layer and a lower free magnetic sub-layer,
    wherein the upper and lower free magnetic sub-layers being separated by a first nonmagnetic intermediate sub-layer;
    wherein each of the pinned magnetic layers has a synthetic ferrimagnetic structure including the upper and lower pinned magnetic sub-layers which are laminated with a second nonmagnetic intermediate sub-layer provided therebetween;
    wherein the side end surfaces of the upper free magnetic sub-layer face the respective upper pinned magnetic sub-layers through the nonmagnetic material layers, and the side end surfaces of the lower free magnetic sub-layer face the respective lower pinned magnetic sub-layers through the nonmagnetic material layers;
    wherein the positions of the top surfaces of the lower pinned magnetic sub-layers are lower than the position of the bottom surface of the upper free magnetic sub-layer, and the positions of the bottom surfaces of the upper pinned magnetic sub-layers are higher than the position of the top surface of the lower free magnetic sub-layer; and
    wherein the upper free magnetic sub-layer and upper pinned magnetic sub-layers are made of magnetic material in one of the groups A and B, and the lower free magnetic sub-layer and lower pinned magnetic sub-layers are made of magnetic materials in the other group.

2. The magnetic detecting element according to claim 1, wherein the first nonmagnetic intermediate sub-layer comprises a nonmagnetic material composed of at least one element selected from Ru, Cr, Rh, Ir, and Os.

3. The magnetic detecting element according to claim 1, further comprising a specular sub-layer disposed between the upper and lower free magnetic sub-layers;
    wherein the specular layer includes at least one material selected from the group consisting of oxides such as Fe—O, Ni—O, Co—O, Co—Fr—O, Co—Fe—Ni—O, Al—O, and Al—Q—O (wherein Q is at least one element selected from B, Si, N, Ti, V, Cr, Zr, Nb, Mo, Hf, Ta, and W); nitrides such as Al—N, Al—Q—N (wherein Q is at least one element selected from B, Si, O, Ti, V, Cr, Mn, Fe, Co, and Ni), and R—N (wherein R is at least one element selected from Ti, V, Cr, Zr, Nb, Mo, Hf, Ta, and W); semimetal whistler alloys; and the like.

4. The magnetic detecting element according to claim 1, further comprising a specular sub-layer in contact with at least one surface of the upper free magnetic sub-layer and the lower free magnetic sub-layer opposite to a surface in contact with the first nonmagnetic intermediate sub-layer,
    wherein the specular layer includes at least one material selected from the group consisting of oxides such as Fe—O, Ni—O, Co—O, Co—Fr—O, Co—Fe—Ni—O, Al—O, and Al—Q—O (wherein Q is at least one element selected from B, Si, N, Ti, V, Cr, Zr, Nb, Mo, Hf, Ta, and W); nitrides such as Al—N, Al—Q—N (wherein Q is at least one element selected from B, Si, O, Ti, V, Cr, Mn, Fe, Co, and Ni), and R—N (wherein R is at least one element selected from Ti, V, Cr, Zr, Nb, Mo, Hf, Ta, and W); semimetal whistler alleys; and the like.

* * * * *

UNITED STATES PATENT AND TRADEMARK OFFICE
CERTIFICATE OF CORRECTION

PATENT NO. : 7,229,706 B2
APPLICATION NO. : 10/755640
DATED : June 12, 2007
INVENTOR(S) : Naoya Hasegawa et al.

It is certified that error appears in the above-identified patent and that said Letters Patent is hereby corrected as shown below:

On the Title Page

In column 2, line 9, under "ABSTRACT", before "a magnetic material" delete "containing" and substitute --comprising-- in its place.

In column 2, line 11, under "ABSTRACT", before "a magnetic material" delete "containing" and substitute --comprising-- in its place.

In column 2, line 14, under "ABSTRACT", delete "$1 \leqq \beta \leqq 1)$" and substitute --$1 \leq \beta \leq 1)$-- in its place.

In the Claims

Columns 43-44, in claim 1, line 25, before "upper free magnetic" delete "a" and substitute --an-- in its place.

Column 44, in claim 4, line 15, after "semimetal whistler" delete "alleys" and substitute --alloys-- in its place.

Signed and Sealed this

Fourth Day of March, 2008

JON W. DUDAS
*Director of the United States Patent and Trademark Office*